United States Patent [19]

Osawa

[11] Patent Number: 5,703,818

[45] Date of Patent: Dec. 30, 1997

[54] TEST CIRCUIT

[75] Inventor: Tokuya Osawa, Tokyo, Japan

[73] Assignee: Mitsubishi Denki Kabushiki Kaisha, Tokyo, Japan

[21] Appl. No.: 811,008

[22] Filed: Mar. 4, 1997

[30] Foreign Application Priority Data

Aug. 26, 1996 [JP] Japan ................... 8-223842

[51] Int. Cl.[6] ................................................. G11C 13/00
[52] U.S. Cl. ........................... 365/201; 365/200; 371/21.1
[58] Field of Search ................................ 365/200, 201; 371/21.1

[56] References Cited

U.S. PATENT DOCUMENTS 5,351,213  9/1994  Nakashima ................... 365/201

FOREIGN PATENT DOCUMENTS

| 56-51678 | 5/1981 | Japan . |
| 3-292700 | 12/1991 | Japan . |
| 4-285799 | 10/1992 | Japan . |
| 5-35392 | 5/1993 | Japan . |
| 6-12897 | 1/1994 | Japan . |
| 6-12898 | 1/1994 | Japan . |

*Primary Examiner*—Terrell W. Fears
*Attorney, Agent, or Firm*—Burns, Doane, Swecker & Mathis, LLP

[57] ABSTRACT

It is an object to provide a test circuit which properly finds faults of memory cells of a storage circuit. Registers XB1, 0, YB1, 0 of a circuit SGC1 supply address data which includes four order all cycle sequence. A generating portion 10a provides "1" when data XB1, 0 are "10" and provides "0" in other cases. A generating portion 11a provides "1" when data XB1,0 are "01" and provides "0" in other cases. One of the outputs of the generating portions 10a, 11a is selected with the data YB1 and a selector S and provided to a RAM 1 as data DI. In the RAM 1, one of word lines is selected by X address data and data of memory cells MC are applied onto bit lines bit 0–3. With this structure, the logic on the bit line selected by the Y address data changes from "0" to "1" or from "1" to "0".

17 Claims, 29 Drawing Sheets

Y1=0/INV=0

Y1=1/INV=0 x : Don't care

Y1=0/INV=0

Y1=1/INV=0 x : Don't care

Y1=0/INV=0

Y1=1/INV=0 x: Don't care

FIG. 11 m : ODD NUMBER $$d0 \begin{cases} = \overline{X(1)\overline{X(0)} + X(3)\overline{X(2)}X(1)X(0) + \cdots + X(m)\overline{X(m-1)}\cdots X(1)\overline{X(0)}} \\ = \overline{X(1)X(0) + X(3)\overline{X(2)}X(1)X(0) + \cdots + X(m)\overline{X(m-1)}\cdots X(1)\overline{X(0)}} \end{cases}$$

$$d1 \begin{cases} = \overline{X(1)\overline{X(0)} + X(3)X(2)X(1)X(0) + \cdots + \overline{X(m)}X(m-1)\cdots X(1)X(0)} \\ = \overline{X(1)X(0) + X(3)\overline{X(2)}X(1)X(0) + \cdots + \overline{X(m)}X(m-1)\cdots X(1)X(0)} \end{cases}$$

m : EVEN NUMBER $$d0 \begin{cases} = \overline{X(0) + X(2)\overline{X(1)}X(0) + \cdots + X(m)\overline{X(m-1)}\cdots \overline{X(1)}X(0)} \\ = \overline{X(0) + X(2)\overline{X(1)}X(0) + \cdots + X(m)\overline{X(m-1)}\cdots \overline{X(1)}X(0)} \end{cases}$$

$$d1 \begin{cases} = \overline{\overline{X(0)} + \overline{X(2)}X(1)X(0) + \cdots + \overline{X(m)}X(m-1)\cdots X(1)X(0)} \\ = \overline{\overline{X(0)} + \overline{X(2)}X(1)X(0) + \cdots + \overline{X(m)}X(m-1)\cdots X(1)X(0)} \end{cases}$$

OUTPUT(OUT) OF SELECTOR IS:

OUT = d0 = (WHEN Yn=0)
    d1 = (WHEN Yn=1)

FIG. 12 m: ODD NUMBER

$d0 \begin{cases} = (\cdots(((X(m)\overline{X(m-1)})+X(m-2))\overline{X(m-3)}+X(m-4))\cdots+X(1))\overline{X(0)} \\ = \overline{(\cdots(((X(m)\overline{X(m-1)})+X(m-2))\overline{X(m-3)}+X(m-4))\cdots+X(1))\overline{X(0)}} \end{cases}$ $d1 \begin{cases} = (\cdots(((\overline{X(m)}X(m-1))+X(m-2))\overline{X(m-3)}+X(m-4))\cdots+\overline{X(1)}X(0)) \\ = \overline{(\cdots(((\overline{X(m)}X(m-1))+X(m-2))\overline{X(m-3)}+X(m-4))\cdots+\overline{X(1)}X(0))} \end{cases}$ m: EVEN NUMBER

$d0 \begin{cases} = (\cdots(((X(m)\overline{X(m-1)})+X(m-2))\overline{X(m-3)}+X(m-4))\cdots+\overline{X(1)}X(0)) \\ = \overline{(\cdots(((X(m)\overline{X(m-1)})+X(m-2))\overline{X(m-3)}+X(m-4))\cdots+\overline{X(1)}X(0))} \end{cases}$ $d1 \begin{cases} = (\cdots(((\overline{X(m)}X(m-1))+X(m-2))\overline{X(m-3)}+X(m-4))\cdots+X(1))\overline{X(0)} \\ = \overline{(\cdots(((\overline{X(m)}X(m-1))+X(m-2))\overline{X(m-3)}+X(m-4))\cdots+X(1))\overline{X(0)}} \end{cases}$

OUTPUT(OUT) OF SELECTOR IS:

OUT=d0=(WHEN Yn=0)

d1=(WHEN Yn=1)

F I G. 1 3

$t-1$th CLOCK SIGNAL	$t$th CLOCK SIGNAL 1 0 0 0 _ x x  →  1 1 0 0 _ 0 x 1 0 0 1 _ x x  →  1 1 0 0 _ 1 x
     ↑  ↑
    X0 Y1

F I G. 1 4

$t$th CLOCK SIGNAL	$t+1$th CLOCK SIGNAL 0 0 0 0 _ x x  →  0 0 0 0 _ 0 x

→  1 0 0 0 _ 0 x

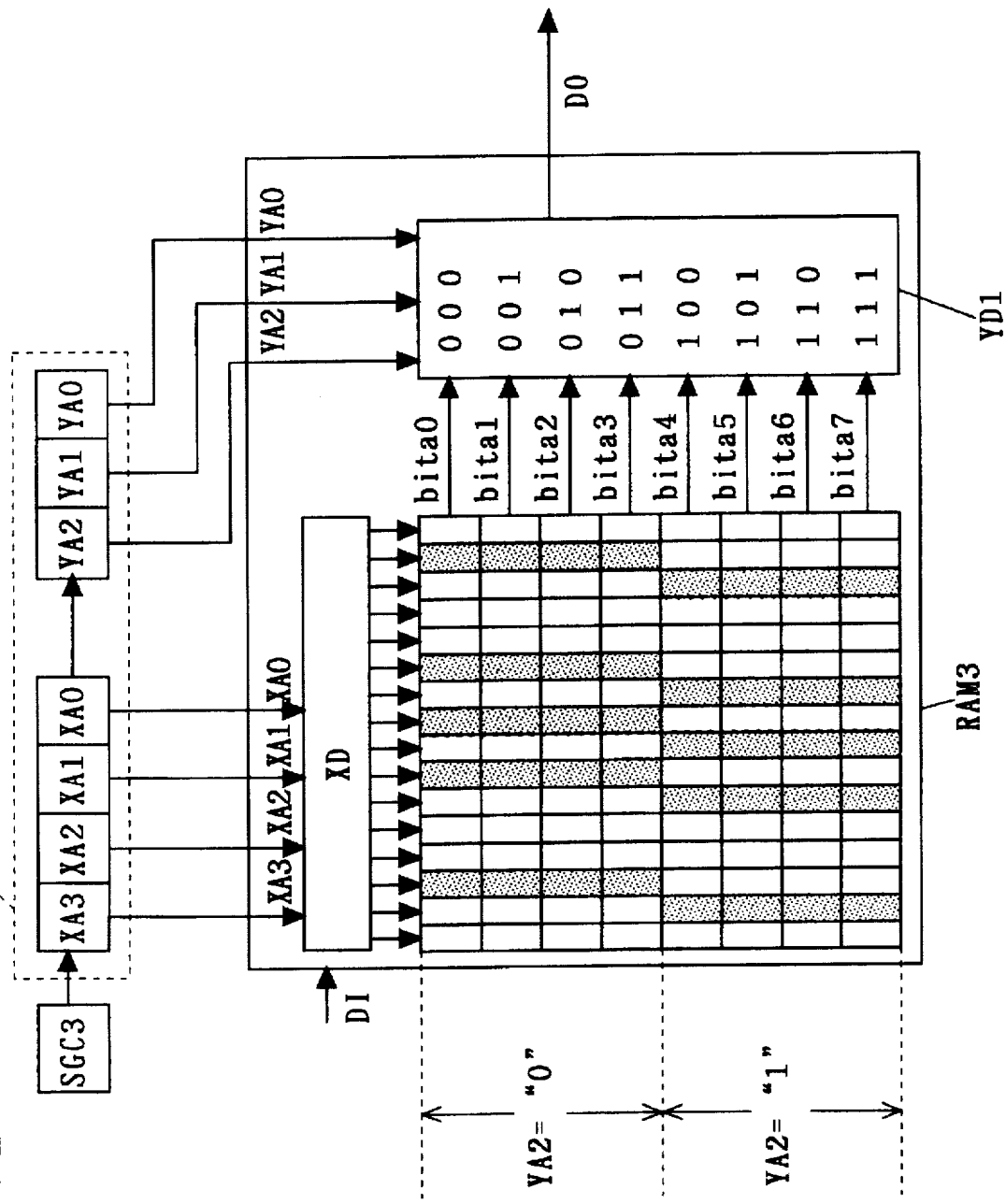
F I G. 2 2

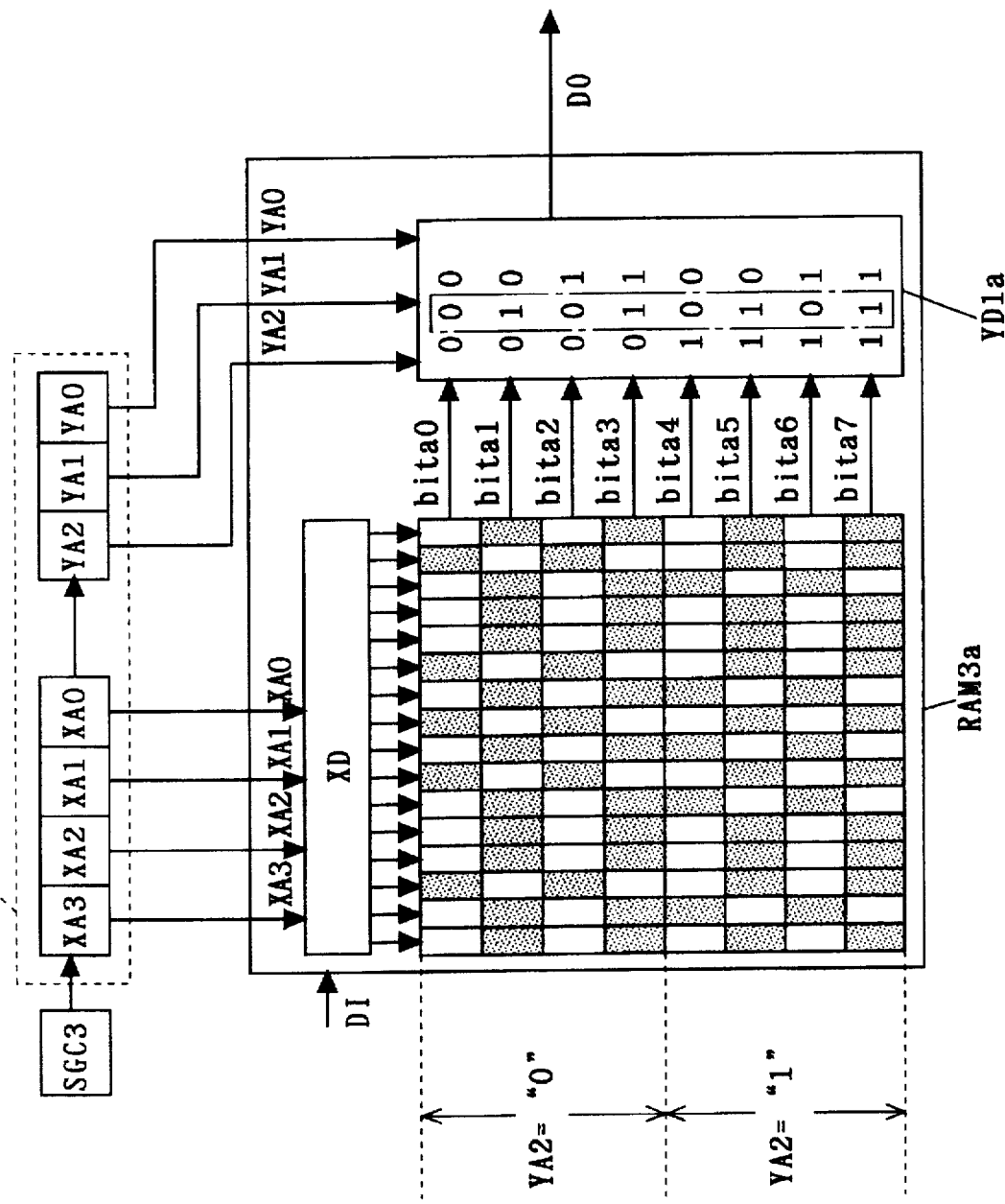
F I G. 2 6

TEST CIRCUIT

BACKGROUND OF THE INVENTION

1. Field of the Invention

The present invention relates to test circuits which are used to test storage circuits.

2. Description of the Background Art

FIG. 30 is a circuit diagram showing a test pattern generating circuit 100 according to a conventional art. The test pattern generating circuit 100 realizes self-test of a RAM 1 which is a memory circuit. FIG. 30 shows the RAM 1 which is an object of the test, the test pattern generating circuit 100 for generating address data fed to the RAM 1 and test pattern corresponding to the address data, and a scan path circuit SP for supplying the address data to the RAM 1.

The scan path circuit SP operates as a flip-flop in common operation. When testing a logic portion (not shown), the scan path circuit SP is used as part of a scan path relating to the logic portion. When testing the RAM 1, the scan path circuit SP is separated from the scan path for the logic portion. At this time, the address data generated by the test pattern generating circuit 100 is fed to the RAM 1 through the scan path circuit SP. The address data and memory cells of the RAM 1 are in one-to-one correspondence.

The RAM 1 illustrated in FIG. 30 is of 16 words. The RAM 1 has an X decoder XD and a Y decoder YD. The X decoder XD decodes data XA1 and XA0 and the Y decoder YD decodes data YA1 and YA0. The data XA1 and XA0 and the data YA1 and YA0 constituting the address data represent values stored in shift registers XA1 and XA0 and shift registers YA1 and YA0, respectively. The reference characters "XA" and "YA" are used in common for the shift registers and data stored in the shift registers. The X decoder XD and the Y decoder YD have their respective output terminals connected to word lines w10–w13 and bit lines bit0–bit3.

Checker board pattern is written as test pattern in the RAM 1 shown in FIG. 30. This checker board pattern is written by the test pattern generating circuit 100.

The test pattern generating circuit 100 includes an all cycle sequence generating circuit 110. The all cycle sequence generating circuit 110 is a circuit which generates four order all cycle sequence and supplies it to the scan path SP. The all cycle sequence generating circuit 110 includes shift registers XB1, XB0, YB1 and YB0. The scan path circuit SP used for the address portion of the RAM 1 is composed of shift registers XA1, XA0, YA1 and YA0.

The shift register XB1 and the shift register XA1 have their respective input terminals connected in common. This configuration pairs the shift registers XB1, XB0, YB1 and YB0 with the shift registers XA1, XA0, YA1 and YA0, respectively. The paired shift registers store the same data values. The shift registers XB1 and XA1 are generically called shift register X1. The same is applied to other registers, too.

The checker board pattern is written as explained below into the group of memory cells arranged in a matrix with four rows and four columns constituting the RAM 1 having the X decoder XD and the Y decoder YD.

In the test pattern generating circuit 100 shown in FIG. 30, a particular set of values stored in the shift registers XB1, XB0, YB1 and YB0 specify address in the RAM 1. In order to realize the algorithm for generation of the checker board pattern, values stored in the shift registers XB0 and YB0 included in the all cycle sequence generating circuit 110 are exclusive-ORed. Input data DI to be written into the RAM 1 is thus generated.

The algorithm for the generation of the checker board pattern is as follows. Here, "exor" indicates performance of exclusive OR operation. The character "X0", for example, represents a value stored in the shift register X0. Inverting logic of a data inversion signal INV enables inversion of the checker board pattern as shown below.

When the data inversion signal INV=0, (1) "0" is written into addresses under X0 exor Y0=0, and (2) "1" is written into addresses under X0 exor Y0=1.

When the data inversion signal INV=1, (1) "1" is written into addresses under X0 exor Y0=0, and (2) "0" is written into addresses under X0 exor Y0=1.

It is understood that if the data inversion signal INV is fixed then only values of the data X0 and Y0 relate to the algorithm for generating the checker board pattern.

FIG. 31 is a schematic diagram showing the memory cells shown in FIG. 30 in more detail. The checker board pattern is written in the group of the memory cells.

When address (XA1, XA0, YA1, YA0) of the RAM 1 is "0010", the word line w10 and the bit line bit2 are selected. At this time, logics on the bit lines bit0 to bit3 are as follows: bit0="0", bit1="1", bit2="0" and bit3="1". As the bit line bit2 is being selected, "0" is outputted from the output terminal DO of the RAM 1.

Consider that in the circuit shown in FIG. 31 the address to the RAM 1 changes from "0010" to "1001", for example. When the address changes from "0010" to "1001", the value outputted from the output terminal DO of the RAM 1 changes from "0" to "1" if it has no fault. If "0" is read in spite of the fact that "1" should have been written in the memory cell corresponding to "1001", it is determined that a fault exists in this memory cell.

As shown in FIG. 31, however, if the memory cell at address "0001" is normal but the memory cell at address "1001" is floating with respect to the bit line, the fault can not be found. It will now be described focusing on the behavior of the bit line bit1.

When address is "0010", the word line w10 is selected and thus the bit line bit1 is supplied with the value set in the memory cell corresponding to address "0001". Similarly, when address is "1001", the word line w12 is selected and thus the bit line bit1 is supplied with the value set in the memory cell corresponding to address "1001". In the circuit shown in FIG. 31, the value set in the memory cell at address "0001" and the value set in the memory cell at address "1001" are both "1".

Accordingly, the bit line bit1 continuously holds the "1" of the memory cell at address "0001" read when the address was "0010" and therefore the output of the output terminal DO changes to "1" even if a fault exists in the memory cell at address "1001". Then the fault is not detected.

This problem can not be solved by changing pattern of generation of pseudo-random numbers constituting address data. This is due to the fact shown below.

The all cycle sequence generating circuit 110 shown in FIG. 30 is composed of an LFSR circuit (Liner Feedback Shift Register). The LFSR circuit is composed of shift registers connected in series. It is possible to generate pseudo-random numbers in various patterns by changing whose logic is exclusive-ORed among the plurality of shift registers forming the LFSR circuit. If the pseudo-random number generated in the ith turn from the LFSR circuit is taken as a pseudo-random number L(i), then the pseudo-random number L(i) shifts one bit in the LFSR circuit as the pseudo-random number L(i+1) is inputted to the most significant bit of the LFSR circuit.

In order to facilitate the understanding, it is described with the circuit shown in FIG. 31 as an example. Concerning X address of the RAM 1, an address selected next to address "00" is "10" or "00" depending on whether the pseudo-random number L(i+1) is "1" or "0". Since the checker board pattern is used, the same value is written in a pair of memory cells which correspond to the two X addresses as long as the same bit line is involved. Hence, generating pseudo-random numbers in various patterns by performing the exclusive-OR operation with different shift registers in the LFSR circuit can not solve the problem above.

SUMMARY OF THE INVENTION

A first aspect of the present invention is directed to a test circuit which comprises a shift register group for row address having first to nth row address registers and a shift register group for column address having first to mth column address registers (n and m are natural numbers of 2 or larger), and the first to nth row address registers and the first to mth column address registers storing different first and second logics constituting a first binary logic, as configuration data configuring address data, the test circuit testing a storage circuit having memory cells that are specified with row address data obtained by decoding the configuration data stored in the first to nth row address registers and column address data obtained by decoding the configuration data stored in the first to mth column address registers. According to the present invention, the nth to first row address registers and the mth to first column address registers are connected in series in this order, the nth row address register being supplied with the configuration data which is shifted in the nth to first row address registers and the mth to first column address registers in this order to provide all cycle sequence data as the address data, wherein an input terminal of the storage circuit is supplied with test data, the test data selectively taking one of the different first and second logics which constitutes a second binary logic, depending on whether the number s (n≧s≧0) of the first logics of the first binary logic continuously stored from the first row address register toward the nth row address register is an even number or an odd number, in a first case where the first logic of the first binary logic is stored in the mth column address register, and the test data selectively taking one of the different first and second logics which constitutes a third binary logic, depending on whether the number t (n≧t≧0) of the second logics of the first binary logic continuously stored from the first row address register toward the nth row address register is an even number or an odd number, in a second case where the second logic of the first binary logic is stored in the mth column address register.

Preferably, according to a second aspect of the present invention, the test circuit comprises first and second data supply circuits, and the first and second data supply circuits respectively supplying total logic operation results in the first and second data supply circuits, the first to nth row address registers respectively storing first to nth data provided by the configuration data, wherein when n is an odd number, the first data supply circuit obtains {(n−1)/2} first logic operation results which are ANDs of a logic of the (2a−1)th (a is a natural number and satisfies 2≦a≦(n+1)/2) data and inverse logics of the first to (2a−2)th data, the total logic operation result in the first data supply circuit being OR or NOR of logics of the first logic operation results and a logic of the first data, the second data supply circuit obtains {(n−1)/2} second logic operation results which are ANDs of an inverse logic of the (2a−1)th data and logics of the first to (2a−2)th data, and the total logic operation result in the second data supply circuit being OR or NOR of logics of the second logic operation results and an inverse logic of the first data, and wherein when n is an even number, the first data supply circuit obtains n/2 third logic operation results which are ANDs of a logic of the 2bth (b is a natural number and satisfies 1≦b≦n/2) data and inverse logics of the first to (2b−1)th data, the total logic operation result in the first data supply circuit being OR or NOR of the third logic operation results, the second data supply circuit obtains n/2 fourth logic operation results which are ANDs of an inverse logic of the 2bth data and logics of the first to (2b−1)th data, and the total logic operation result in the second data supply circuit being OR or NOR of the fourth logic operation results, and wherein the total logic operation results in the first and second data supply circuits are supplied as the test data in the first and second cases, respectively.

Preferably, according to a third aspect of the present invention, the test circuit comprises first and second data supply circuits, and the first and second data supply circuits supplying total logic operation results in the first and second data supply circuits, respectively, the first to nth row address registers respectively storing first to nth data provided by the configuration data, the first and second data supply circuits each including first to (n−1)th logic operation elements provided in correspondence with the first to (n−1)th row address registers, the first to (n−1)th logic operation elements providing first to (n−1)th results, respectively, wherein the (n−1)th logic operation element of the first data supply circuit provides the (n−1)th result in the first data supply circuit which is AND of a logic of the nth data and an inverse logic of the (n−1)th data, the (n−1)th logic operation element of the second data supply circuit provides the (n−1)th result in the second data supply circuit which is AND of an inverse logic of the nth data and a logic of the (n−1)th data, the (n−a)th (a is an odd number and satisfies 1<a<n) logic operation element of the first data supply circuit provides the (n−a)th result in the first data supply circuit which is AND of a logic of the (n−a+1)th result in the first data supply circuit and an inverse logic of the (n−a)th data, the (n−a)th logic operation element of the second data supply circuit provides the (n−a)th result in the second data supply circuit which is AND of a logic of the (n−a+1)th result in the second data supply circuit and a logic of the (n−a)th data, the (n−b)th (b is an even number and satisfies 2≦b<n) logic operation element of the first data supply circuit provides the (n−b)th result in the first data supply circuit which is OR of a logic of the (n−b+1)th result in the first data supply circuit and a logic of the (n−b)th data, and the (n−b)th logic operation element of the second data supply circuit provides the (n−b)th result in the second data supply circuit which is OR of a logic of the (n−b+1)th result in the second data supply circuit and an inverse logic of the (n−b)th data, and the total logic operation result in the first data supply circuit being a logic of the first result in the first data supply circuit or its inversion logic, wherein the total logic operation result in the second data supply circuit being a logic of the first result in the second data supply circuit or its inversion logic, and wherein the total logic operation results in the first and second data supply circuits are provided as the test data in the first and second cases, respectively.

Preferably, according to a fourth aspect of the present invention, in the test circuit, the input terminal of the storage circuit is a data input terminal to which write data to be written into the memory cells is inputted.

Preferably, according to a fifth aspect of the present invention, in the test circuit, a first input terminal of a comparison circuit is connected to an output terminal of the storage circuit, a second input terminal of the comparison circuit is supplied with the test data, the storage circuit is supplied with an enable signal for controlling writing of the write data into the memory cells, and the enable signal indicates "enable" when writing into the memory cells and indicates "disable" when reading from the memory cells.

Preferably, according to a sixth aspect of the present invention, in the test circuit, the input terminal of the storage circuit is an enable terminal relating to writing of data into the memory cells, the storage circuit has a data input terminal to which write data to be written into the memory cells is inputted, the logic of the write data takes first and second logics constituting a fourth binary logic, and the logic of the test data inputted to the enable terminal takes an inverted state or a non-inverted state depending on whether the logic of the write data takes the first logic or the second logic of the fourth binary logic.

Preferably, according to a seventh aspect of the present invention, in the test circuit, one of the configuration data stored in an arrangement reference register which is one of the first to (m−1)th column address registers functions as an arrangement reference signal, the arrangement reference signal takes different logics for two of the memory cells which are adjacent to each other in a .direction in which the column address data selects the memory cells, and whether to invert the test data or not is determined depending upon the arrangement reference signal.

Preferably, according to an eighth aspect of the present invention, the test circuit is a storage means storing the configuration data and the test data in itself.

According to the structure of the first aspect, it is possible to properly swing logic on a bit line of a storage circuit from one logic of binary logic to the other according to patterns of address data. This is due to the fact that the address data is predictable because it is uniquely determined on the basis of patterns provided by configuration data which shifts in order in the row address shift register group and the column address register group. This makes it possible to certainly detect faults of memory cells, enabling efficient test of a storage circuit.

According to the structures of the second aspect and the third aspect, the structure of the first aspect is achieved. Particularly, according to the structure of the second aspect, a storage circuit can be tested at a high speed because the logic operation results are provided in parallel. Particularly, according to the structure of the third aspect, each of the first to nth data can be used only once in one logical operation in each of the first and the second data supply circuits. This reduces circuit scale of the test circuit.

According to the structures of the fourth and sixth aspects, the test circuit according to the first, second or third aspect is realized by inputting test data to the data input terminal or to the enable terminal. Particularly, according to the structure of the fourth aspect, it is possible to finish writing write data into memory cells by generating one cycle of all cycle sequence. Particularly, according to the structure of the sixth aspect, it is possible to write data into memory cells with a reduced number of circuits added to the row address shift register group and the column address register group usually provided as part of a scan path. This reduces circuit scale of the test circuit.

According to the structure of the fifth aspect, it is possible to use the test circuit according to the first, second or third aspect not only to generate write data when writing but also to generate expected values of the data when reading data from the memory cells. This improves versatility of the test circuit.

According to the structure of the seventh aspect, the first and second logics constituting the second or third binary logic are exclusively written into two of the memory cells which are adjacent to each other in the direction in which the column address data selects the memory cells. For example, when a short circuit occurs in association with adjacent memory cells, data are read which are different from those read when no short circuit occurs. This insures the detection of a fault in the storage circuit to increase the reliability of the test circuit.

According to the structure of the eighth aspect, it is not necessary to provide the logic elements realizing the structure of the second or third aspect. For example, supplying test data using a logic portion, having a scan path composed of a group of row address shift registers and a group of column address registers, as storage means reduces circuit scale of the test circuit.

It is an object of the present invention to provide a test circuit capable of properly detecting faults in memory cells of a storage circuit.

These and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a diagram illustrating logical expressions realized by the test circuit having the parallel structure of the first preferred embodiment.

FIG. 12 is a diagram illustrating logical expressions realized by the test circuit having the serial structure of the first preferred embodiment.

FIG. 13 is a schematic diagram showing an example of shift of address data.

FIG. 14 is a schematic diagram showing another example of shift of the address data.

FIG. 22 is a circuit diagram illustrating a structure of a RAM written with data on the basis of regularity according to the first to fifth preferred embodiments.

FIG. 26 is a circuit diagram illustrating another structure of the RAM written with data on the basis of regularity according to the sixth preferred embodiment.

DESCRIPTION OF THE PREFERRED EMBODIMENTS

First Preferred Embodiment

Figure 1:
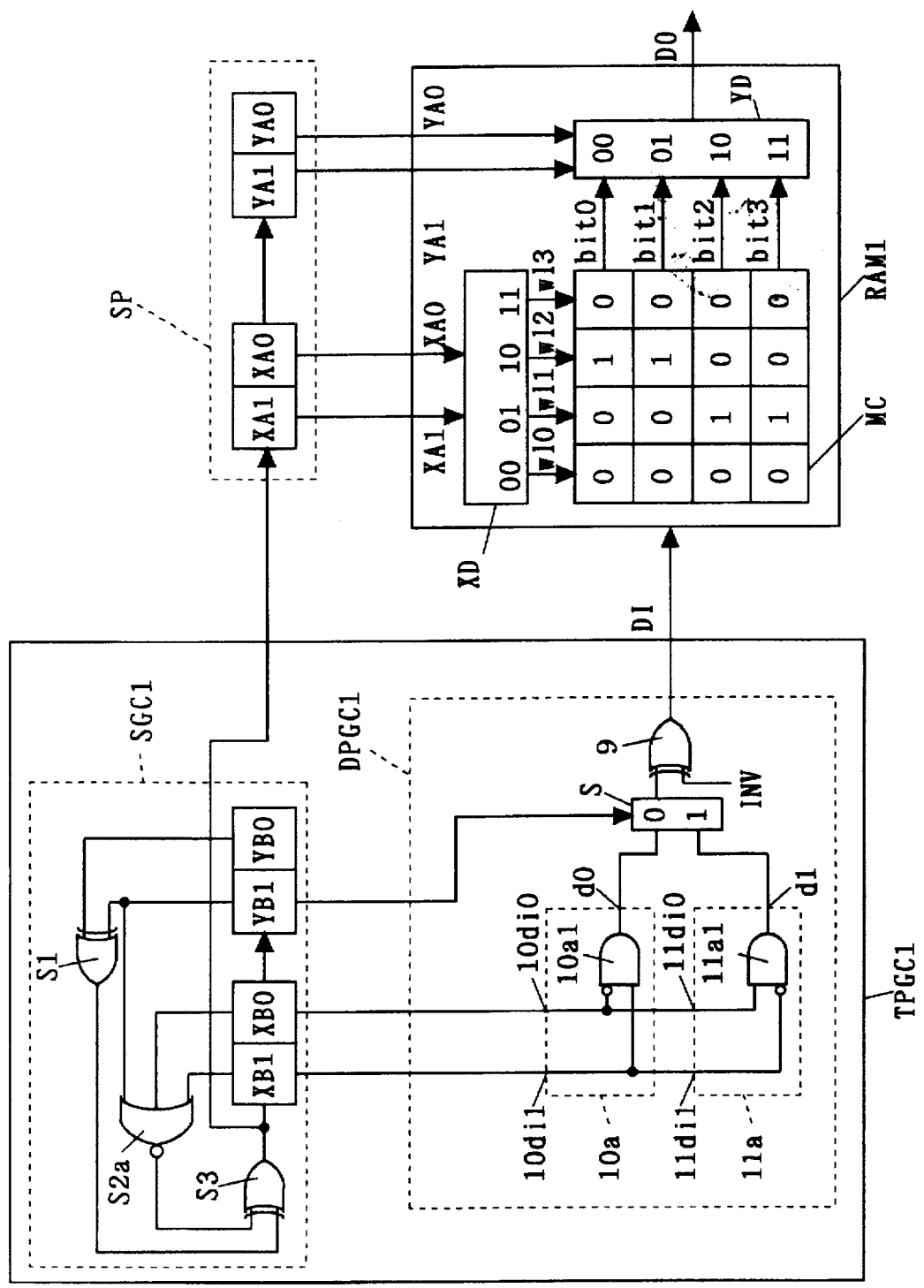
FIG. 1 is a circuit diagram showing a structure of a first example of a test circuit according to a first preferred embodiment.

This preferred embodiment discloses a test pattern generating circuit which supplies test pattern suitable for detecting faults to memory cells of a storage circuit on the basis of regularity of change of address data supplied from a scan path composed of shift registers. In this preferred embodiment, the same components as those in the conventional art are shown with the same reference characters. Note that components shown with the reference characters "1a", "1b" are generically shown at the reference character "1", for example.

An input/output terminal of a memory circuit such as RAM provided in ASIC etc. is usually connected to a logic portion. With this structure, it is difficult to directly test the memory circuit using an external terminal of the semiconductor integrated circuit. Methods for testing memory circuits include the self-test method, according to which a memory test circuit is provided in the chip of a semiconductor integrated circuit.

FIG. 1 is a circuit diagram illustrating this preferred embodiment. This diagram shows the RAM 1, an object of the test, a test pattern generating circuit TPGC1 for generating address data and test pattern corresponding to the address data, and a scan path circuit SP for supplying the address data to the RAM 1. The test pattern generating circuit TPGC1 is adapted for the scan test method that is frequently used in testing a logic portion, which is used to realize a self-test to the RAM 1, a memory circuit.

The RAM 1 is a 16-word RAM including 16 memory cells MC arranged in a matrix with four rows and four columns. The RAM 1 includes four word lines w10–w13 and four bit lines bit0–bit 3, which select memory cells MC. It also includes an X decoder XD and a Y decoder YD. One of the word lines w10–w13 and one of the bit lines bit0–bit3 are selected according to a binary number inputted to the decoders.

The scan path circuit SP is composed of shift registers XA1 and XA0 and shift registers YA1 and YA0 connected in series in order. In common operation the scan path circuit SP operates as a flip-flop. When testing a logic portion not shown, it is used as part of a scan path for the logic portion. When testing the RAM 1, however, the scan path circuit SP is separated from the scan path for the logic portion and it supplies address data to the RAM 1. The scan path circuit SP is an LFSR (Linear Feedback Shift Register) circuit.

When testing the RAM 1, address data generated by the test pattern generating circuit TPGC1, which will be fully described later, is fed into the X decoder XD and the Y decoder YD of the RAM 1 through the scan path circuit SP. The address data is a 4-digit binary number, which is supplied by data XA1, XA0 and data YA1, YA0 as "XA1, XA0, YA1, YA0" in order from the high-order digit. The data XA1 and XA0 provide X address and the data YA1 and YA0 provide Y address.

The data XA1 and XA0 are decoded by the X decoder XD and the data YA1 and YA0 are decoded by the Y decoder YD. In the X decoder XD, a word line having a number provided by a binary number "XA1, XA0" is selected. In other words, when a binary number "XA1, XA0" corresponds to a decimal number "j", the word line w1j is selected. Similarly, when a binary number "YA1, YA0" corresponds to a decimal number "k", the bit line bitk is selected. With this structure, address data and one of the plurality of memory cells MC in the RAM 1 correspond in a one-to-one manner.

The RAM 1 shown in FIG. 1 includes a test pattern unique to the present invention written therein. This test pattern has been written by the test pattern generating circuit TPGC1. The test pattern generating circuit TPGC1 will now be described.

The test pattern generating circuit TPGC1 includes an all cycle sequence generating circuit SGC1 for generating all cycle sequence. The all cycle sequence is a set of logics composed of M series to which a logic whose all digits are "0", namely a set including all patterns representable with combinations of logics on digits. Table 1 illustrates the four order (4-digit) all cycle sequence.

TABLE 1

| Pattern No. | All cycle sequence | | | |
|---|---|---|---|---|
| | XB1 | XB0 | YB1 | YB0 |
| 0 | 0 | 0 | 0 | 0 |
| 1 | 1 | 0 | 0 | 0 |
| 2 | 0 | 1 | 0 | 0 |
| 3 | 0 | 0 | 1 | 0 |
| 4 | 1 | 0 | 0 | 1 |
| 5 | 1 | 1 | 0 | 0 |
| 6 | 0 | 1 | 1 | 0 |
| 7 | 1 | 0 | 1 | 1 |
| 8 | 0 | 1 | 0 | 1 |
| 9 | 1 | 0 | 1 | 0 |
| 10 | 1 | 1 | 0 | 1 |
| 11 | 1 | 1 | 1 | 0 |
| 12 | 1 | 1 | 1 | 1 |
| 13 | 0 | 1 | 1 | 1 |
| 14 | 0 | 0 | 1 | 1 |
| 15 | 0 | 0 | 0 | 1 |

The all cycle sequence generating circuit SGC1 shown in FIG. 1 is a circuit which sequentially generates individual data constituting the four order all cycle sequence every time a clock signal is inputted and sequentially supplies the data to the scan path SP. The all cycle sequence generating circuit SGC1 includes shift registers XB1, XB0, YB1 and YB0 connected in series in order.

The input terminals of the shift register XB1 and the shift register XA1 are connected in common to each other. This configuration pairs the shift registers XB1, XB0, YB1 and YB0 and the shift registers XA1, XA0, YA1 and YA0 respectively in this order. Since data inputted to the shift register XB1 and the shift register XA1 shift in the scan path circuits in order, a pair of shift registers store the game value of data. Accordingly, the shift registers XB1 and XA1 are generically called shift register X1. The same is applied to other shift registers, too.

Figure 2:
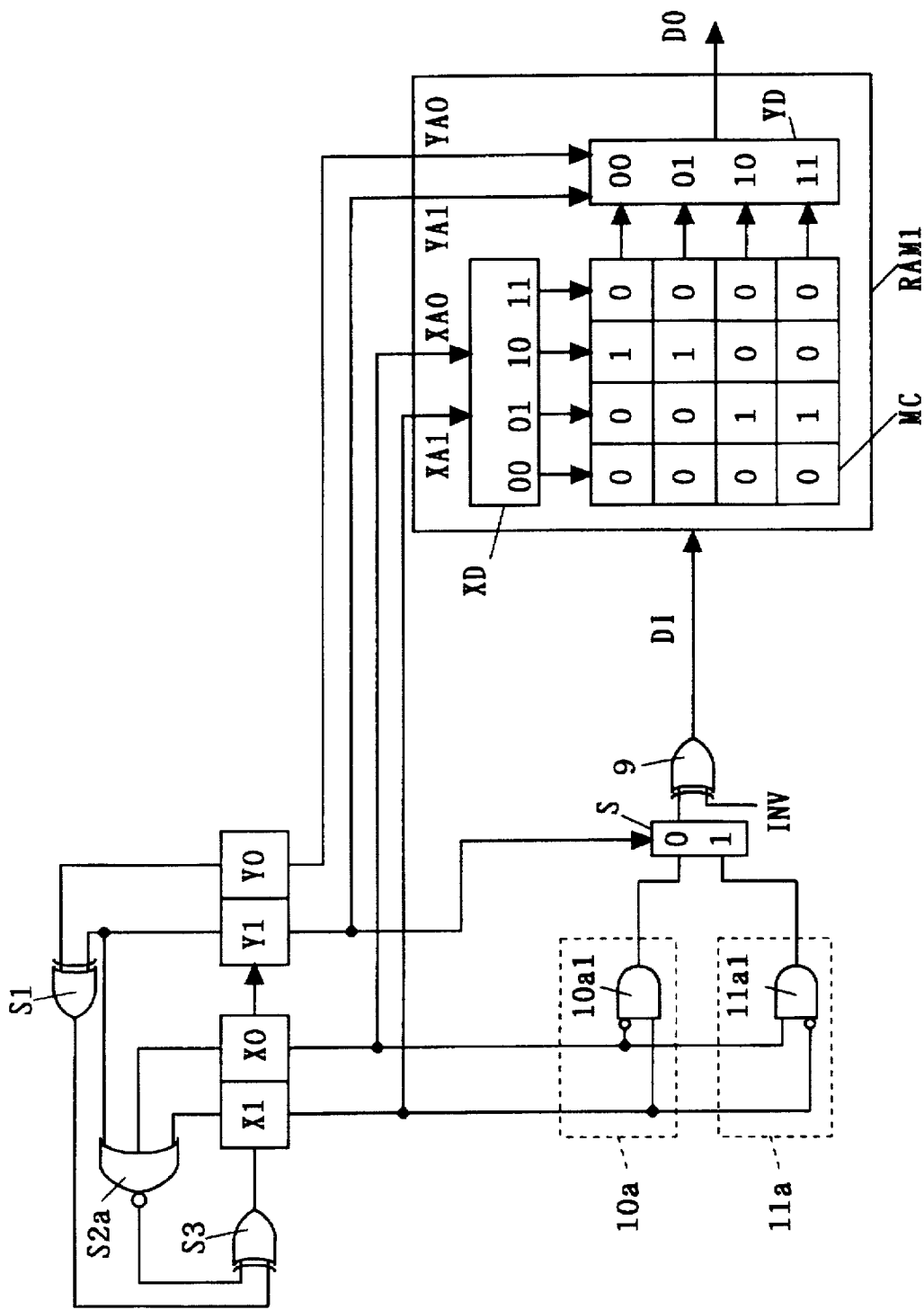
FIG. 2 is a circuit diagram showing a structure of the first example of the test circuit according to the first preferred embodiment.

FIG. 2 is a circuit diagram illustrating the circuit shown in FIG. 1 with the scan path SP removed therefrom. It shows that the address data and the test pattern are generated according to the data X1, X0, Y1 and Y0 which sequentially shift in the shift registers X1 and X0 and the shift registers Y1 and Y0. It is understood from FIG. 2 that it is also possible to apply the present invention to one having no scan path SP.

An EX-OR gate S3 of the all cycle sequence generating circuit SGC1 in FIG. 1 has its two input terminals connected to an output terminal of an NOR gate S2a whose three input terminals are connected to the shift registers XB1, XB0 and YB1 and an output terminal of an EX-OR gate S1 whose two input terminals are connected to the shift registers YB1 and YB0. The output terminal of the EX-OR gate S3 is connected to the input terminals of the shift registers XB1 and XA1 in common.

This circuit configuration provides the four order all cycle sequence shown in Table 1 according to the shift of data caused by a clock signal. It is preferred that "0000" is set in advance in the shift registers X1, X0, Y1 and Y0 so that the numbers formed by the data XA1, XA0, YA1 and YA0 and the data XB1, XB0, YB1 and YB0 are the same in the scan path SP and the all cycle sequence generating circuit SGC1. Shifting the data forming the all cycle sequence into the scan path circuit SP enables efficient addressing.

Next, the data pattern generating circuit DPGC1 included in the test pattern generating circuit TPGC1 will now be described. The test pattern generating circuit TPGC1 generates test pattern to be written in memory cells MC of the RAM 1 with the data pattern generating circuit DPGC1. The data pattern generating circuit DPGC1 includes first and second data generating portions 10a and 11a, a selector S and an EX-OR gate 9. The first and second data generating portions 10a and 11a have first input terminals 10di0 and 11di0, second input terminals 10di1 and 11di1 and output terminals d0 and d1, respectively.

The first input terminal 10di0 and the first input terminal 11di0 are connected to the shift register XB0 in common and the second input terminal 10di1 and the second input terminal 11di1 are connected to the shift register XB1 in common. The numbers at the ends of the reference characters used for the input terminals and the shift registers indicate the correspondence.

The output terminals d0 and d1 of the first and second data generating portions are connected to the data input 0, 1 terminals of the selector S. The selector S has its control terminal connected to the shift register YB1 which makes a pair with the shift register YA1 which supplies the most significant position of Y address data. An output of the selector S is switched to outputs of the first and second output portions 10a and 11a depending on whether the data YB1 is "0" or "1".

The selector S has its output terminal connected to the data input terminal DI of the RAM 1 through the EX-OR gate 9. The EX-OR gate 9 is for inverting the test pattern which is written into the memory cells MC of the RAM 1. When a data inversion signal INV inputted thereto takes "0"/"1", it non-inverts/inverts the logic outputted from the selector S.

The functions of the first and second data generating portions 10a and 11a will now be described in detail. The character "x" used hereinafter indicates arbitrary one of "0" and "1". According to X address of the RAM 1, the data generating portion 10a generates "0" with address "00", "1" with address "10", and "0" with address "x1" as data d0.

Figure 3A:
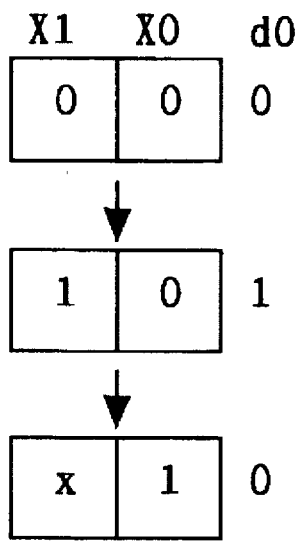
FIGS. 3A and 3B are schematic diagrams showing a first example of logic structure realized by the test circuit according to the first preferred embodiment.
Figure 3B:
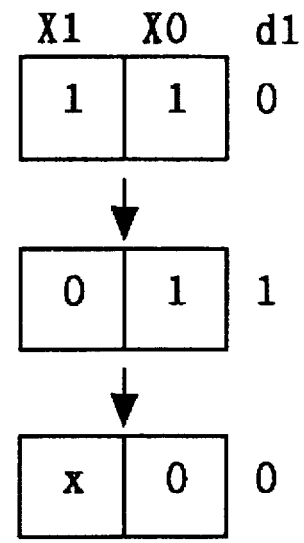

Also according to X address of the RAM 1, the data generating portion 11a generates "0" with address "11", "1" with address "01" and "0" with address "x0" as data d1. FIGS. 3A and 3B are schematic diagrams illustrating data d0 and d1. The data generating portions 10a and 11a have the circuit configuration shown in FIG. 1 to achieve this logic configuration.

The data generating portions 10a and 11a are each composed of gates 10a1 and 11a1 each having two input terminals and one output terminal. The gate 10a1 is a gate which ANDs a logic of the most significant bit in data constituting X address inputted to itself and inverted versions of logics of all bits other than the most significant one. The gate 11a1 is a gate which ANDs an inverted version of logic of the most significant bit in data forming X address and logics of all bits other than the most significant one. In the example shown in FIG. 1, since X address is formed of the data XB1 and XB0, the gate 10a1 ANDs an inversion logic of the data XB0 and a logic of the data XB1. The gate 11a1 ANDs a logic of the data XB0 and an inversion logic of the data XB1.

The data pattern shown in FIG. 1 is written into the memory cells MC of the RAM 1 by using the circuit composed of the shift registers XB1, XB0, YB1 and YB0 corresponding to the scan path SP and the data pattern generating circuit DPGC1. Table 2 illustrates the data X1, X0, Y1 and Y0 generated in the data pattern generating circuit DPGC1, the input data DI and the output data DO, and the data bit0-bit3. The input data DI and the output data DO are data at the data input terminal DI and the data output .terminal DO of the RAM 1, respectively. This table shows the way that the test pattern generating circuit TPGC1 writes data into the RAM 1 and reads data about all addresses.

TABLE 2

| W | X 10 | Y 10 | d0 | d1 | S | DI | DO | bit 3 2 1 0 |
|---|---|---|---|---|---|---|---|---|
| 0 | 00 | 00 | 0 | 0 | 0 | 0 | 0 | x x x 0 |
| 0 | 10 | 00 | 1 | 0 | 0 | 1 | 1 | x x x 1 |
| 0 | 01 | 00 | 0 | 1 | 0 | 0 | 0 | x x x 0 |
| 0 | 00 | 10 | 0 | 0 | 1 | 0 | 0 | x 0 x 0 |
| 0 | 10 | 01 | 1 | 0 | 0 | 1 | 1 | x x 1 1 |
| 0 | 11 | 00 | 0 | 0 | 0 | 0 | 0 | x x x 0 |
| 0 | 01 | 10 | 0 | 1 | 1 | 1 | 1 | x 1 x 0 |
| 0 | 10 | 11 | 1 | 0 | 1 | 0 | 0 | 0 x 1 1 |
| 0 | 01 | 01 | 0 | 1 | 0 | 0 | 0 | x 1 0 0 |
| 0 | 10 | 10 | 1 | 0 | 1 | 0 | 0 | 0 0 1 1 |
| 0 | 11 | 01 | 0 | 0 | 0 | 0 | 0 | x x 0 0 |
| 0 | 11 | 10 | 0 | 0 | 1 | 0 | 0 | x 0 0 0 |
| 0 | 11 | 11 | 0 | 0 | 1 | 0 | 0 | 0 0 0 0 |
| 0 | 01 | 11 | 0 | 1 | 1 | 1 | 1 | 1 1 0 0 |
| 0 | 00 | 11 | 0 | 0 | 1 | 0 | 0 | 0 0 x 0 |
| 0 | 00 | 01 | 0 | 0 | 0 | 0 | 0 | 0 0 0 0 |
| 1 | 00 | 00 | 0 | 0 | 0 | 0 | 0 | 0 0 0 0 |
| 1 | 10 | 00 | 1 | 0 | 0 | 1 | 1 | 0 0 1 1 |
| 1 | 01 | 00 | 0 | 1 | 0 | 0 | 0 | 1 1 0 0 |
| 1 | 00 | 10 | 0 | 0 | 1 | 0 | 0 | 0 0 0 0 |
| 1 | 10 | 01 | 1 | 0 | 0 | 1 | 1 | 0 0 1 1 |
| 1 | 11 | 00 | 0 | 0 | 0 | 0 | 0 | 0 0 0 0 |
| 1 | 01 | 10 | 0 | 1 | 1 | 1 | 1 | 1 1 0 0 |
| 1 | 10 | 11 | 1 | 0 | 1 | 0 | 0 | 0 0 1 1 |
| 1 | 01 | 01 | 0 | 1 | 0 | 0 | 0 | 1 1 0 0 |
| 1 | 10 | 10 | 1 | 0 | 1 | 0 | 0 | 0 0 1 1 |
| 1 | 11 | 01 | 0 | 0 | 0 | 0 | 0 | 0 0 0 0 |
| 1 | 11 | 10 | 0 | 0 | 1 | 0 | 0 | 0 0 0 0 |
| 1 | 11 | 11 | 0 | 0 | 1 | 0 | 0 | 0 0 0 0 |
| 1 | 01 | 11 | 0 | 1 | 1 | 1 | 1 | 1 1 0 0 |
| 1 | 00 | 11 | 0 | 0 | 1 | 0 | 0 | 0 0 0 0 |
| 1 | 00 | 01 | 0 | 0 | 0 | 0 | 0 | 0 0 0 0 |

Figure 30:
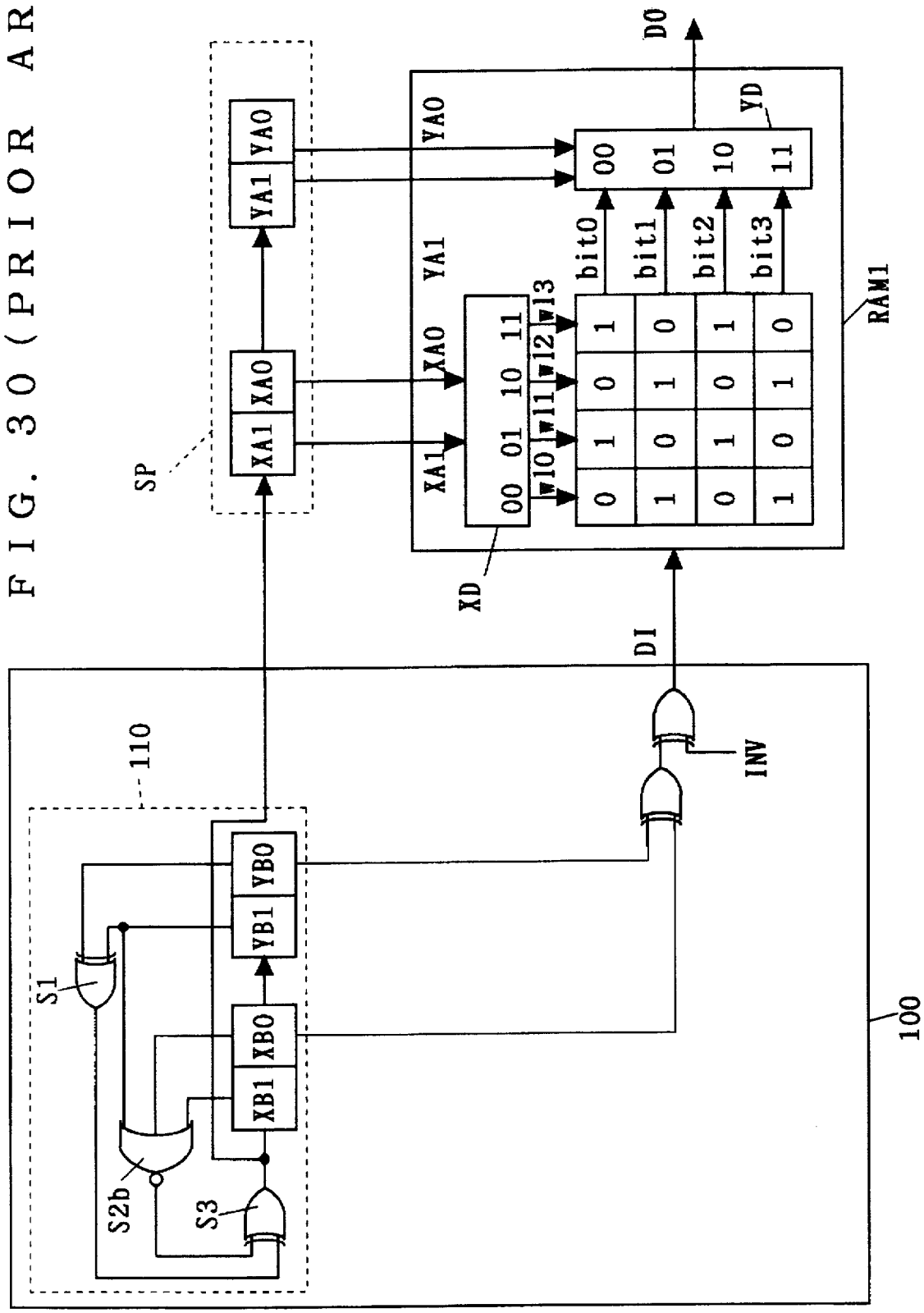
FIG. 30 is a circuit diagram showing a conventional test circuit.
Figure 31:
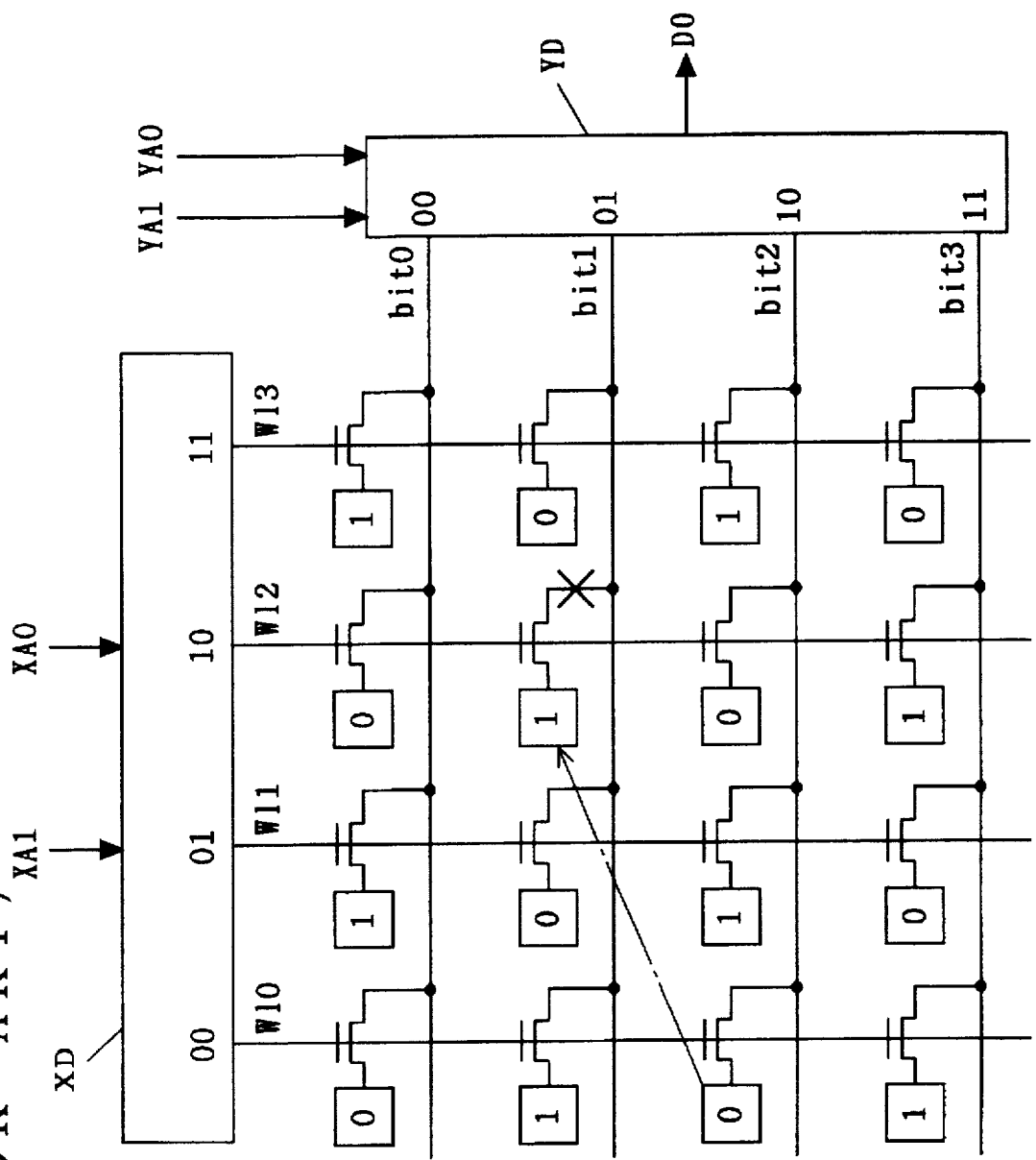
FIG. 31 is a schematic diagram showing a conventional test method.

The character "W" used in this table represents the logic WEC of a write enable signal WEC for enabling write into the RAM 1, which is not shown in FIG. 1. Writing is enabled when the logic WEC is "0" and inhibited when it is "1." The output data DO when the logic WEC is "1" are values expected when the RAM 1 is normal. Table 3 relates to a test of the RAM 1 with the test pattern generating circuit 100 shown in FIG. 30.

TABLE 3

| W | X 10 | Y 10 | DI | DO | bit 3 2 1 0 |
|---|---|---|---|---|---|
| 0 | 00 | 00 | 0 | x | x x x x |
| 0 | 10 | 00 | 0 | 0 | x x x 0 |
| 0 | 01 | 00 | 1 | 1 | x x x 1 |
| 0 | 00 | 10 | 0 | 0 | x 0 x 0 |
| 0 | 10 | 01 | 1 | 1 | x x 1 0 |
| 0 | 11 | 00 | 1 | 1 | x x x 1 |
| 0 | 01 | 10 | 1 | 1 | x 1 x 1 |
| 0 | 10 | 11 | 1 | 1 | 1 x 1 0 |
| 0 | 01 | 01 | 0 | 0 | x 1 0 1 |
| 0 | 10 | 10 | 0 | 0 | 1 0 1 0 |
| 0 | 11 | 01 | 0 | 0 | x x 0 1 |
| 0 | 11 | 10 | 1 | 1 | x 1 0 1 |
| 0 | 11 | 11 | 0 | 0 | 0 1 0 1 |
| 0 | 01 | 11 | 0 | 0 | 0 1 0 1 |
| 0 | 00 | 11 | 1 | 1 | 1 0 x 0 |

TABLE 3-continued

| W | X 10 | Y 10 | DI | DO | bit 3 2 1 0 |
|---|---|---|---|---|---|
| 0 | 00 | 01 | 1 | 1 | 1 0 1 0 |
| 1 | 00 | 00 | 0 | 0 | 1 0 1 0 |
| 1 | 10 | 00 | 0 | 0 | 1 0 1 0 |
| 1 | 01 | 00 | 1 | 1 | 0 1 0 1 |
| 1 | 00 | 10 | 0 | 0 | 1 0 1 0 |
| 1 | 10 | 01 | 1 | 1 | 1 0 1 0 |
| 1 | 11 | 00 | 1 | 1 | 0 1 0 1 |
| 1 | 01 | 10 | 1 | 1 | 0 1 0 1 |
| 1 | 10 | 11 | 1 | 1 | 1 0 1 0 |
| 1 | 01 | 01 | 0 | 0 | 0 1 0 1 |
| 1 | 10 | 10 | 0 | 0 | 1 0 1 0 |
| 1 | 11 | 01 | 0 | 0 | 0 1 0 1 |
| 1 | 11 | 10 | 1 | 1 | 0 1 0 1 |
| 1 | 11 | 11 | 0 | 0 | 0 1 0 1 |
| 1 | 01 | 11 | 0 | 0 | 0 1 0 1 |
| 1 | 00 | 11 | 1 | 1 | 1 0 1 0 |
| 1 | 00 | 01 | 1 | 1 | 1 0 1 0 |

In data bit0–bit3 shown in Table 2 and Table 3, in the parts surrounded by one-dot chain lines, a fault due to floating between a memory cell MC and the bit line can not be detected. This is due to the fact that data on the bit line maintains "0" or "1" without changing from "0" to "1" or from "1" to "0" even if there is no fault in these parts.

The comparison between Table 2 and Table 3 shows that a less number of parts are surrounded by the one-dot chain lines in Table 2 than in Table 3. In more detail, the parts surrounded by the one-dot chain lines in Table 2 exist only in the region of X address "00" and X address "11" and it is improved as compared with Table 3 in other addresses.

Figure 4:
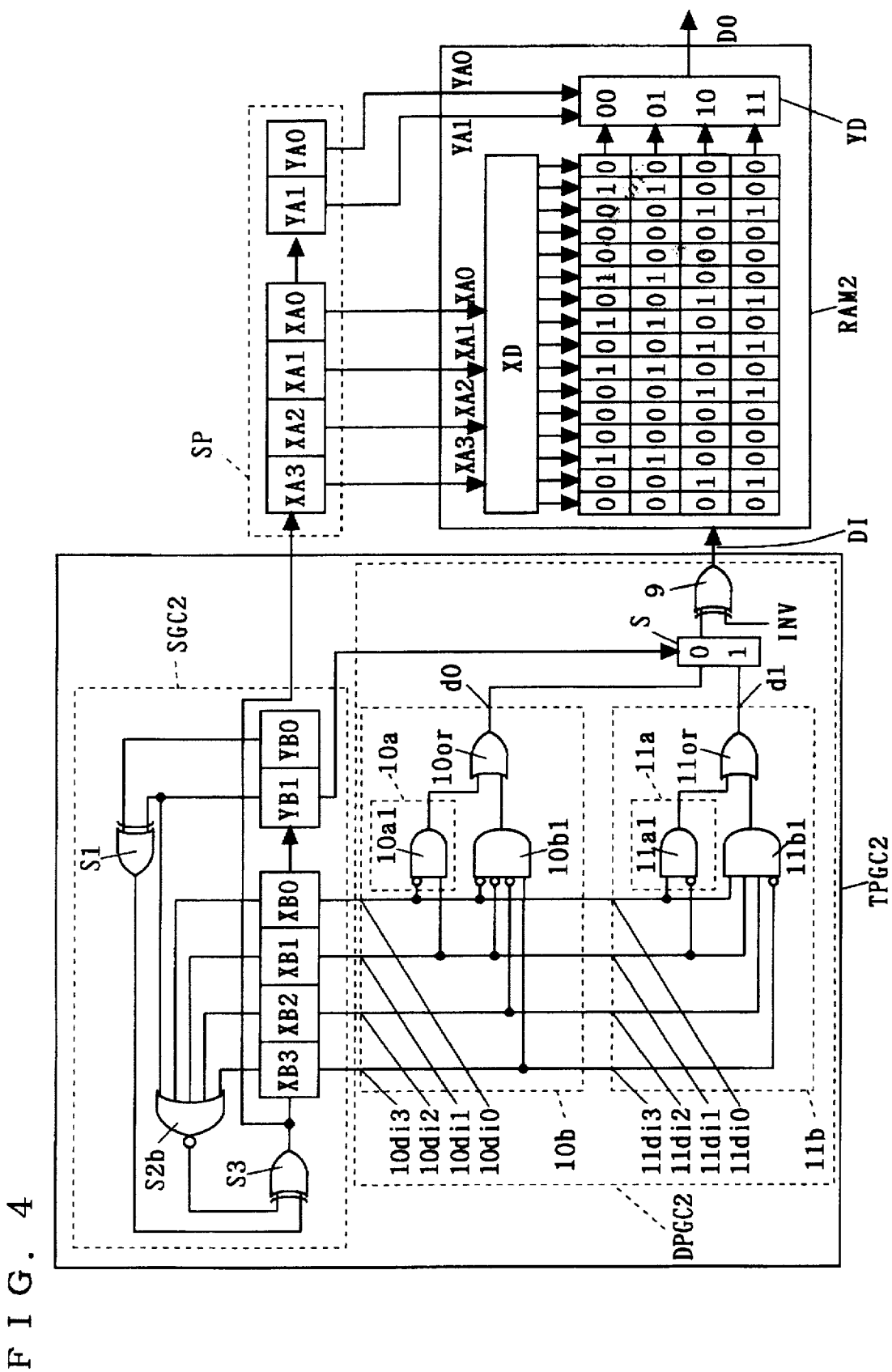
FIG. 4 is a circuit diagram showing a structure of a first example of a second example of the test circuit according to the first preferred embodiment.

The same applies to RAMs having a larger number of memory cells MC than the RAM 1. FIG. 4 is a circuit diagram illustrating a test pattern generating circuit TPGC2 used for a RAM 2 having memory cells arranged in 16 rows×4 columns. With the increase in scale of the RAM, it further includes shift registers X2 and X3 and their associated circuitry in addition to the shift registers X0 and X1 shown in FIG. 1. The NOR gate S2a of the all cycle sequence generating circuit SGC1 shown in FIG. 1 is replaced by the NOR gate S2b for NOT-ORing the data XB3–XB0, YB1 to form the all cycle sequence generating circuit SGC2.

Figure 5A:
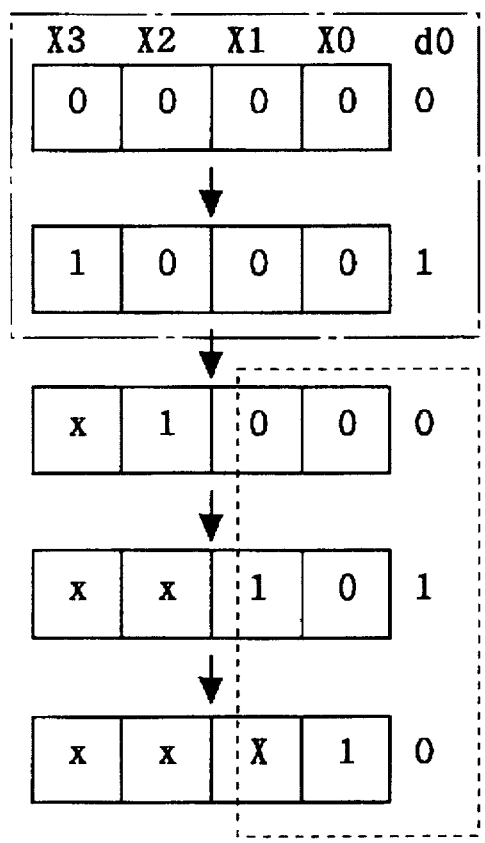
FIGS. 5A and 5B are schematic diagrams showing a second example of the logic structure realized by the test circuit according to the first preferred embodiment.
Figure 5B:
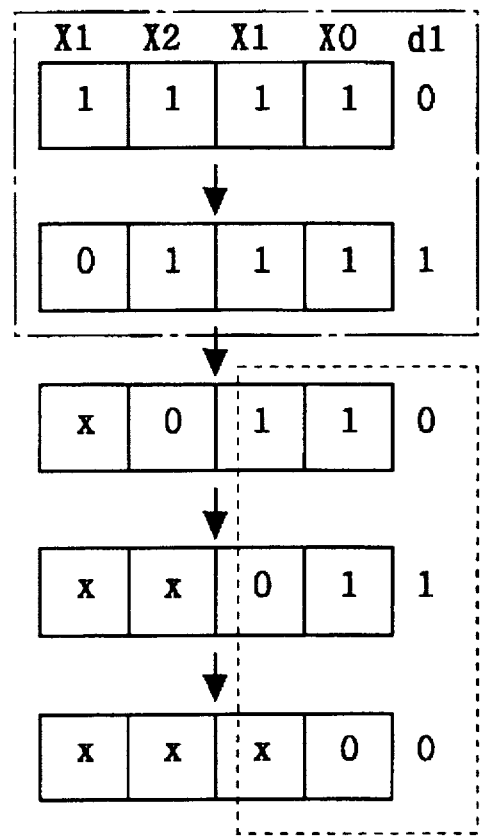

The data generating portions 10a and 11a shown in FIG. 1 are replaced by the data generating portions 10b and 11b. FIGS. 5A and 5B are schematic diagrams illustrating data d0 and d1 which are outputted from the data generating portions 10b and 11b according to the data X3–X0. Concerning X address, the data generating portion 10b generates "0" with address "0000", "1" with address "1000", "0" with address "x100", "1" with address "xx10" and "0" with address "xxx1" as data d0.

Also concerning X address, the data generating portion 11b generates "0" with address "1111", "1" with address "0111", "0" with address "x011", "1" with address "xx01" and "0" with address "xxx0", as data d1.

As can be seen from the description above, the data generating portion 10b outputs "0" as data d0 when the number of "0"s which continue from data X0 toward data X3 is even (including 0) and outputs "1" as data d0 when it is odd. Similarly, the data generating portion 11b outputs "0" as data d1 when the number of "1"s which continue from data X0 toward data X3 is even (including 0) and outputs "1" as data d1 when it is odd.

The parts surrounded by the broken lines in FIGS. 5A and 5B correspond to the data generating patterns realized by the data generating portions 10a and 11a for the RAM 1 having $2^2$ kinds of X addresses shown in FIG. 1. As compared with the data generating portions 10a and 11a, the data generating portions 10b and 11b are further required to realize the logic in the two lines from the top (surrounded by the one-dot chain line) in FIGS. 5A and 5B in order to adjust itself to the RAM 2 having $2^4$ kinds of X addresses shown in FIG. 4.

Table 4 and Table 5 illustrate the results of test of the RAM 2 using the test pattern generating circuit TPGC2 shown in FIG. 4. Table 4 and Table 5 connect at the one-dot chain line to form one table together.

Table 6 and Table 7 illustrate the test results with the conventional checker board pattern. Table 6 and Table 7 also connect at the one-dot chain line to constitute one table. In Tables 4 to 7, assuming that the address data pattern is generated in the same order when writing in and reading from the RAM, those in the case in which "W" representing logic of the write enable signal WEC is "0" are not shown in full.

TABLE 4

| W | xad | yad | d0 | d1 | S | DI | DO | bit 3 2 1 0 |
|---|-----|-----|----|----|---|----|----|-------------|
| 0 | 0000 | 00 | 0 | 0 | 0 | 0 | 0 | 0 0 0 0 |
| 1 | 0000 | 00 | 0 | 0 | 0 | 0 | 0 | 0 0 0 0 |
| 1 | 1000 | 00 | 1 | 0 | 0 | 1 | 1 | 0 0 1 1 |
| 1 | 0100 | 00 | 0 | 0 | 0 | 0 | 0 | 0 0 0 0 |
| 1 | 0010 | 00 | 1 | 0 | 0 | 1 | 1 | 0 0 1 1 |
| 1 | 0001 | 00 | 0 | 1 | 0 | 0 | 0 | 1 1 0 0 |
| 1 | 0000 | 10 | 0 | 0 | 1 | 0 | 0 | 0 0 0 0 |
| 1 | 1000 | 01 | 1 | 0 | 0 | 1 | 1 | 0 0 1 1 |
| 1 | 1100 | 00 | 0 | 0 | 0 | 0 | 0 | 0 0 0 0 |
| 1 | 0110 | 00 | 1 | 0 | 0 | 1 | 1 | 0 0 1 1 |
| 1 | 0011 | 00 | 0 | 0 | 0 | 0 | 0 | 0 0 0 0 |
| 1 | 0001 | 10 | 0 | 1 | 1 | 1 | 1 | 1 1 0 0 |
| 1 | 1000 | 11 | 1 | 0 | 1 | 0 | 0 | 0 0 1 1 |
| 1 | 0100 | 01 | 0 | 0 | 0 | 0 | 0 | 0 0 0 0 |
| 1 | 1010 | 00 | 1 | 0 | 0 | 1 | 1 | 0 0 1 1 |
| 1 | 0101 | 00 | 0 | 1 | 0 | 0 | 0 | 1 1 0 0 |
| 1 | 0010 | 10 | 1 | 0 | 1 | 0 | 0 | 0 0 1 1 |
| 1 | 1001 | 01 | 0 | 1 | 0 | 0 | 0 | 1 1 0 0 |
| 1 | 1100 | 10 | 0 | 0 | 1 | 0 | 0 | 0 0 0 0 |
| 1 | 1110 | 01 | 1 | 0 | 0 | 1 | 1 | 0 0 1 1 |
| 1 | 1111 | 00 | 0 | 0 | 0 | 0 | 0 | 0 0 0 0 |
| 1 | 0111 | 10 | 0 | 1 | 1 | 1 | 1 | 1 1 0 0 |
| 1 | 1011 | 11 | 0 | 0 | 1 | 0 | 0 | 0 0 0 0 |
| 1 | 0101 | 11 | 0 | 1 | 1 | 1 | 1 | 1 1 0 0 |
| 1 | 0010 | 11 | 1 | 0 | 1 | 0 | 0 | 0 0 1 1 |
| 1 | 0001 | 01 | 0 | 1 | 0 | 0 | 0 | 1 1 0 0 |
| 1 | 1000 | 10 | 1 | 0 | 1 | 0 | 0 | 0 0 1 1 |
| 1 | 1100 | 01 | 0 | 0 | 0 | 0 | 0 | 0 0 0 0 |
| 1 | 1110 | 00 | 1 | 0 | 0 | 1 | 1 | 0 0 1 1 |
| 1 | 0111 | 00 | 0 | 1 | 0 | 0 | 0 | 1 1 0 0 |
| 1 | 0011 | 10 | 0 | 0 | 1 | 0 | 0 | 0 0 0 0 |
| 1 | 1001 | 11 | 0 | 1 | 1 | 1 | 1 | 1 1 0 0 |
| 1 | 0100 | 11 | 0 | 0 | 1 | 0 | 0 | 0 0 0 0 |
| 1 | 0010 | 01 | 1 | 0 | 0 | 1 | 1 | 0 0 1 1 |
| 1 | 1001 | 00 | 0 | 1 | 0 | 0 | 0 | 1 1 0 0 |

TABLE 5

| 1 | 0100 | 10 | 0 | 0 | 1 | 0 | 0 | 0 0 0 0 |
|---|------|----|----|----|----|----|----|---------|
| 1 | 1010 | 01 | 1 | 0 | 0 | 1 | 1 | 0 0 1 1 |
| 1 | 1101 | 00 | 0 | 1 | 0 | 0 | 0 | 1 1 0 0 |
| 1 | 0110 | 10 | 1 | 0 | 1 | 0 | 0 | 0 0 1 1 |
| 1 | 1011 | 01 | 0 | 0 | 0 | 0 | 0 | 0 0 0 0 |
| 1 | 1101 | 10 | 0 | 1 | 1 | 1 | 1 | 1 1 0 0 |
| 1 | 1110 | 11 | 1 | 0 | 1 | 0 | 0 | 0 0 1 1 |
| 1 | 0111 | 01 | 0 | 1 | 0 | 0 | 0 | 1 1 0 0 |
| 1 | 1011 | 10 | 0 | 0 | 1 | 0 | 0 | 0 0 0 0 |
| 1 | 1101 | 11 | 0 | 1 | 1 | 1 | 1 | 1 1 0 0 |
| 1 | 0110 | 11 | 1 | 0 | 1 | 0 | 0 | 0 0 1 1 |
| 1 | 0011 | 01 | 0 | 0 | 0 | 0 | 0 | 1 1 0 0 |
| 1 | 1001 | 10 | 0 | 0 | 1 | 1 | 1 | 0 0 0 0 |
| 1 | 1100 | 11 | 0 | 0 | 1 | 0 | 0 | 0 0 0 0 |
| 1 | 0110 | 01 | 1 | 0 | 0 | 1 | 1 | 0 0 1 1 |
| 1 | 1011 | 00 | 0 | 0 | 0 | 0 | 0 | 0 0 0 0 |
| 1 | 0101 | 10 | 0 | 1 | 1 | 1 | 1 | 1 1 0 0 |
| 1 | 1010 | 11 | 1 | 0 | 1 | 0 | 0 | 0 0 1 1 |
| 1 | 0101 | 01 | 0 | 1 | 0 | 0 | 0 | 1 1 0 0 |
| 1 | 1010 | 10 | 1 | 0 | 1 | 0 | 0 | 0 0 1 1 |
| 1 | 1101 | 01 | 0 | 1 | 0 | 0 | 0 | 1 1 0 0 |
| 1 | 1110 | 10 | 1 | 0 | 1 | 0 | 0 | 0 0 1 1 |
| 1 | 1111 | 01 | 0 | 0 | 0 | 0 | 0 | 0 0 0 0 |
| 1 | 1111 | 10 | 0 | 0 | 1 | 0 | 0 | 0 0 0 0 |
| 1 | 1111 | 11 | 0 | 0 | 1 | 0 | 0 | 0 0 0 0 |
| 1 | 0111 | 11 | 0 | 1 | 1 | 1 | 1 | 1 1 0 0 |
| 1 | 0011 | 11 | 0 | 0 | 1 | 0 | 0 | 0 0 0 0 |
| 1 | 0001 | 11 | 0 | 1 | 1 | 1 | 1 | 1 1 0 0 |
| 1 | 0000 | 11 | 0 | 0 | 1 | 0 | 0 | 0 0 0 0 |
| 1 | 0000 | 01 | 0 | 0 | 0 | 0 | 0 | 0 0 0 0 |

TABLE 6

| W | xad | yad | DI | DO | bit 3 2 1 0 |
|---|-----|-----|----|----|-------------|
| 0 | 0000 | 01 | 1 | 1 | 1 0 1 0 |
| 1 | 0000 | 00 | 0 | 0 | 1 0 1 0 |
| 1 | 1000 | 00 | 0 | 0 | 1 0 1 0 |
| 1 | 0100 | 00 | 0 | 0 | 1 0 1 0 |
| 1 | 0010 | 00 | 0 | 0 | 1 0 1 0 |
| 1 | 0001 | 00 | 1 | 1 | 0 1 0 1 |
| 1 | 0000 | 10 | 0 | 0 | 1 0 1 0 |
| 1 | 1000 | 01 | 1 | 1 | 1 0 1 0 |
| 1 | 1100 | 00 | 0 | 0 | 1 0 1 0 |
| 1 | 0110 | 00 | 0 | 0 | 1 0 1 0 |
| 1 | 0011 | 00 | 1 | 1 | 0 1 0 1 |
| 1 | 0001 | 10 | 1 | 1 | 0 1 0 1 |
| 1 | 1000 | 11 | 1 | 1 | 1 0 1 0 |
| 1 | 0100 | 01 | 1 | 1 | 1 0 1 0 |
| 1 | 1010 | 00 | 0 | 0 | 1 0 1 0 |
| 1 | 0101 | 00 | 1 | 1 | 0 1 0 1 |
| 1 | 0010 | 10 | 0 | 0 | 1 0 1 0 |
| 1 | 1001 | 01 | 0 | 0 | 0 1 0 1 |
| 1 | 1100 | 10 | 0 | 0 | 1 0 1 0 |
| 1 | 1110 | 01 | 1 | 1 | 1 0 1 0 |
| 1 | 1111 | 00 | 1 | 1 | 0 1 0 1 |
| 1 | 0111 | 10 | 1 | 1 | 0 1 0 1 |
| 1 | 1011 | 11 | 0 | 0 | 0 1 0 1 |
| 1 | 0101 | 11 | 0 | 0 | 0 1 0 1 |
| 1 | 0010 | 11 | 1 | 1 | 1 0 1 0 |
| 1 | 0001 | 01 | 0 | 0 | 0 1 0 1 |
| 1 | 1000 | 10 | 0 | 0 | 1 0 1 0 |
| 1 | 1100 | 01 | 1 | 1 | 1 0 1 0 |
| 1 | 1110 | 00 | 0 | 0 | 1 0 1 0 |
| 1 | 0111 | 00 | 1 | 1 | 0 1 0 1 |
| 1 | 0011 | 10 | 1 | 1 | 0 1 0 1 |
| 1 | 1001 | 11 | 0 | 0 | 0 1 0 1 |
| 1 | 0100 | 11 | 1 | 1 | 1 0 1 0 |
| 1 | 0010 | 01 | 1 | 1 | 1 0 1 0 |
| 1 | 1001 | 00 | 1 | 1 | 0 1 0 1 |

TABLE 7

| 1 | 0100 | 10 | 0 | 0 | 1 0 1 0 | 1 0 1 0 |
|---|------|----|----|----|---------|---------|
| 1 | 1010 | 01 | 1 | 1 | 1 0 1 0 | 1 0 1 0 |
| 1 | 1101 | 00 | 1 | 1 | 0 1 0 1 | 0 1 0 1 |
| 1 | 0110 | 10 | 0 | 0 | 1 0 1 0 | 1 0 1 0 |
| 1 | 1011 | 01 | 0 | 0 | 0 1 0 1 | 0 1 0 1 |
| 1 | 1101 | 10 | 1 | 1 | 0 1 0 1 | 0 1 0 1 |
| 1 | 1110 | 11 | 1 | 1 | 1 0 1 0 | 1 0 1 0 |
| 1 | 0111 | 01 | 0 | 0 | 0 1 0 1 | 0 1 0 1 |
| 1 | 1011 | 10 | 1 | 1 | 0 1 0 1 | 0 1 0 1 |
| 1 | 1101 | 11 | 0 | 0 | 0 1 0 1 | 0 1 0 1 |
| 1 | 0110 | 11 | 1 | 1 | 1 0 1 0 | 1 0 1 0 |
| 1 | 0011 | 01 | 0 | 0 | 0 1 0 1 | 0 1 0 1 |
| 1 | 1001 | 10 | 1 | 1 | 0 1 0 1 | 0 1 0 1 |
| 1 | 1100 | 11 | 1 | 1 | 1 0 1 0 | 1 0 1 0 |
| 1 | 0110 | 01 | 1 | 1 | 1 0 1 0 | 1 0 1 0 |
| 1 | 1011 | 00 | 1 | 1 | 0 1 0 1 | 0 1 0 1 |
| 1 | 0101 | 10 | 1 | 1 | 0 1 0 1 | 0 1 0 1 |
| 1 | 1010 | 11 | 1 | 1 | 1 0 1 0 | 1 0 1 0 |
| 1 | 0101 | 01 | 0 | 0 | 0 1 0 1 | 0 1 0 1 |
| 1 | 1010 | 10 | 0 | 0 | 1 0 1 0 | 1 0 1 0 |
| 1 | 1101 | 01 | 0 | 0 | 0 1 0 1 | 0 1 0 1 |
| 1 | 1110 | 10 | 0 | 0 | 1 0 1 0 | 1 0 1 0 |
| 1 | 1111 | 01 | 0 | 0 | 0 1 0 1 | 0 1 0 1 |
| 1 | 1111 | 10 | 1 | 1 | 0 1 0 1 | 0 1 0 1 |
| 1 | 1111 | 11 | 0 | 0 | 0 1 0 1 | 0 1 0 1 |
| 1 | 0111 | 11 | 0 | 0 | 0 1 0 1 | 0 1 0 1 |
| 1 | 0011 | 11 | 0 | 0 | 0 1 0 1 | 0 1 0 1 |
| 1 | 0001 | 11 | 0 | 0 | 0 1 0 1 | 0 1 0 1 |
| 1 | 0000 | 11 | 1 | 1 | 1 0 1 0 | 1 0 1 0 |
| 1 | 0000 | 01 | 1 | 1 | 1 0 1 0 | 1 0 1 0 |

As shown in these tables, a less number of parts are surrounded by the one-dot chain lines in Table 4 and Table 5 than in Table 6 and Table 7. In the test results shown in Table 4 and Table 5, the parts surrounded by the one-dot chain lines exist only around X address "0000" and X address "1111" and it is improved in other addresses as compared with Table 6 and Table 7.

A circuit configuration for realizing the logic shown in FIGS. 5A and 5B is shown in FIG. 4. The data generating portions 10b and 11b include the data generating portions 10a and 11a, respectively, which realize the logic structure in the parts surrounded by the broken line in FIGS. 5A and 5B. In order to realize the logic structure in the parts surrounded by the one-dot chain lines in FIGS. 5A and 5B, the data generating portions 10b and 11b include gates 10b1 and 11b1, respectively.

The gate 10b1 is a gate which ANDs a logic of the most significant bit in data X3–X0 constituting X address inputted to itself and inverted versions of logics of all bits other than the most significant one. The gate 11b1 is a gate which ANDs an inverted version of the logic of the most significant bit in the data X3–X0 forming X address and the logics of all bits other than the most significant bit. The OR gates 10or and 11or are provided for ORing outputs of the gates 10a1 and 10b1 and outputs of the gates 11a1 and 11b1 and the outputs of the OR gates 10or and 11or are inputted to the data input 0, 1 terminals of the selector S, respectively. The gate 10a1 and the gate 10b1 are parallel to each other with respect to the OR gate 10or, and the gate 11a1 and the gate 11b1 are parallel to each other with respect to the OR gate 11or.

ORing the outputs of the gates 10a1 and 10b1 and ORing the outputs of the gates 11a1 and 11b1 realize the logics shown in FIGS. 5A and 5B.

Figure 6:
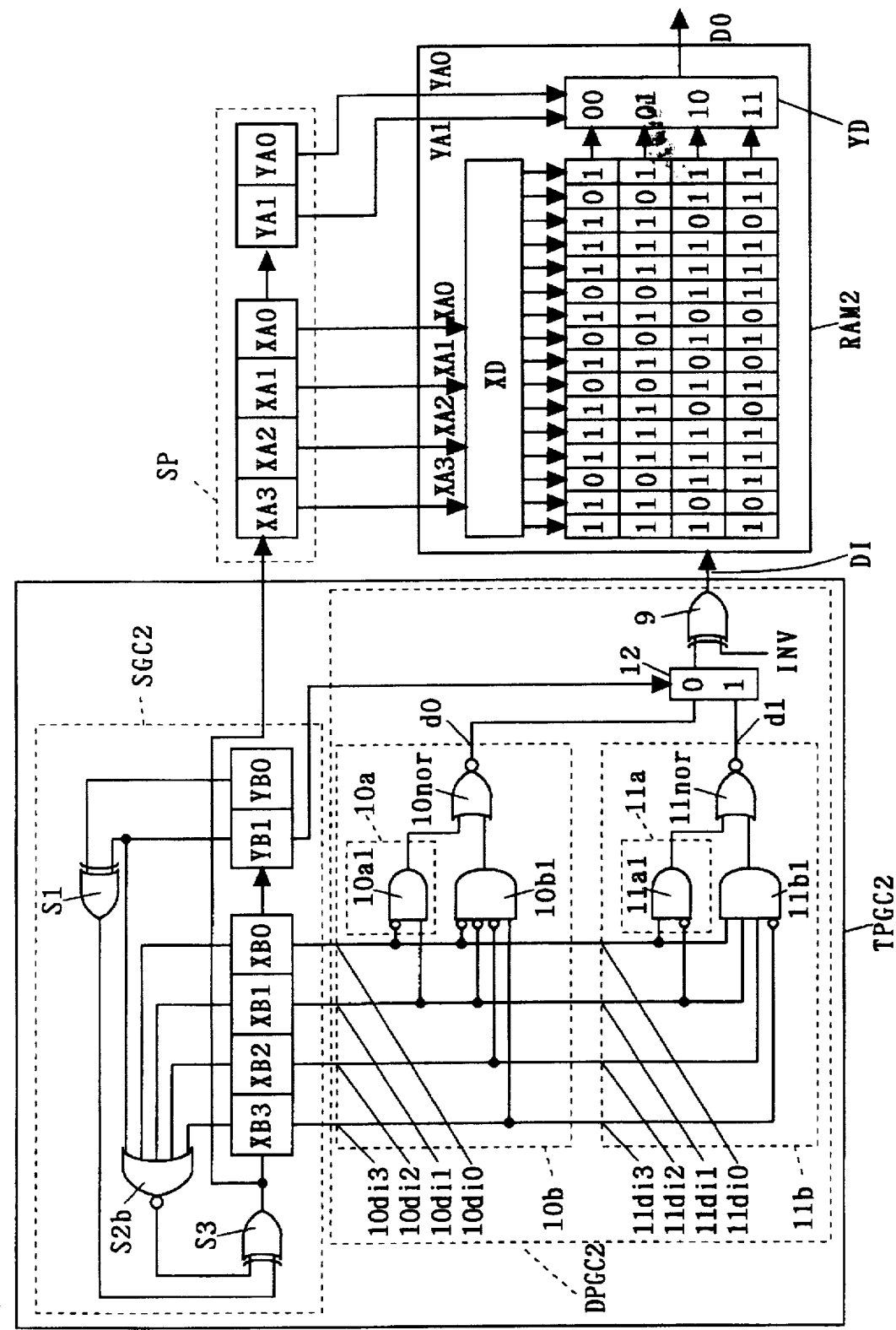
FIG. 6 is a circuit diagram showing a structure of a second example of the second example of the test circuit according to the first preferred embodiment.

In this invention, it is essential that data on a bit line changes from "0" to "1" or from "1" to "0" every time data forming address shifts. Accordingly, the OR gates 10or and 11or may be replaced by NOR gates 10nor and 11nor, respectively. FIG. 6 is a circuit diagram illustrating the structure of a test pattern generating circuit TPGC2 having the NOR gates 10nor and 11nor in place of the OR gates 10or and 11or. As shown in this diagram, "0" and "1" are inverted in the patterns written in the memory cells of the RAM 2 in FIG. 4 and FIG. 6. Replacement from the OR gate 10or to the NOR gate 10nor and the replacement from the OR gate 11or to the NOR gate 11nor can be independently made.

Figure 7:
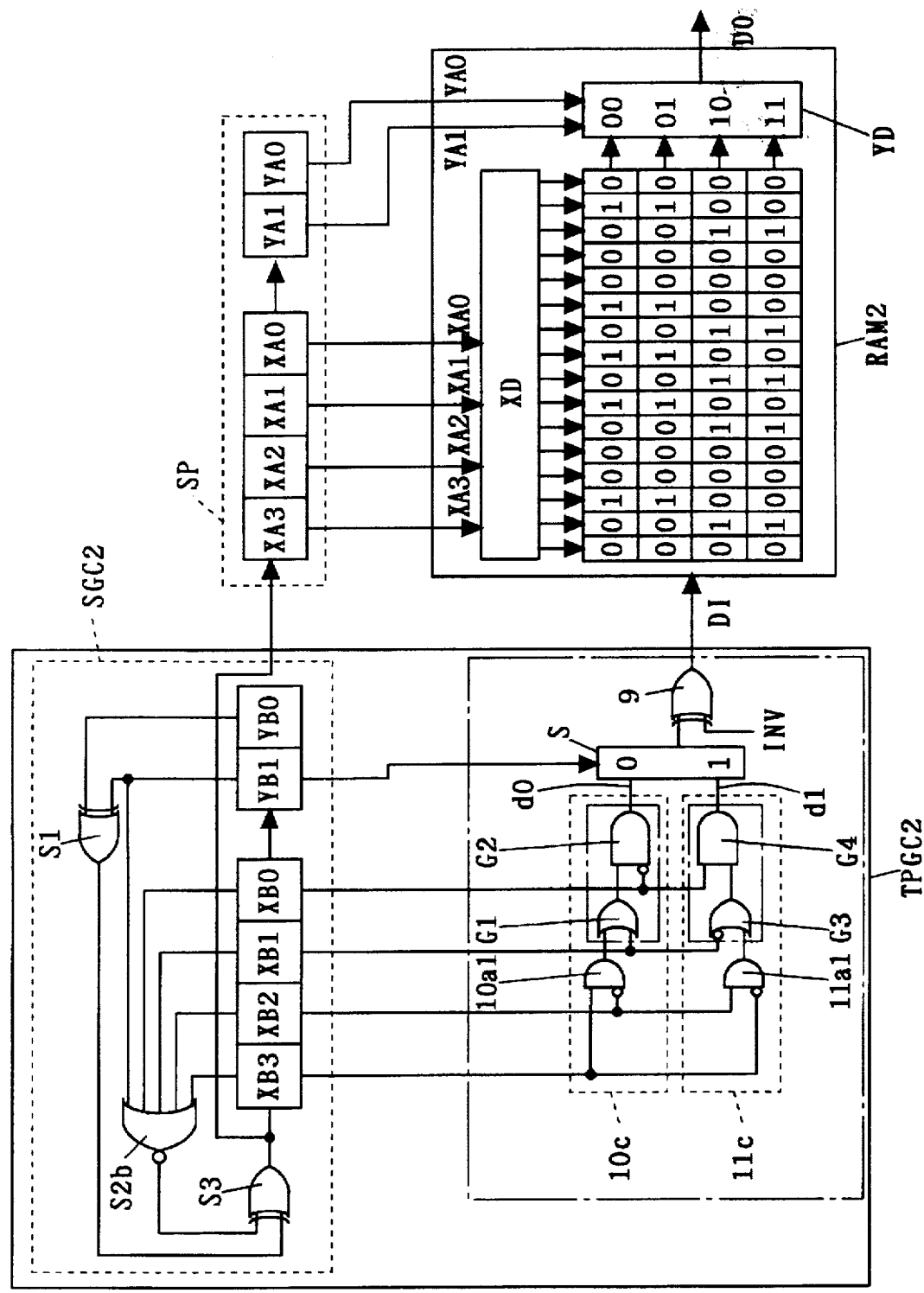
FIG. 7 is a circuit diagram showing a structure of a third example of the second example of the test circuit according to the first preferred embodiment.

The data generating portions 10b and 11b shown in FIG. 4 may be replaced by the data generating portions 10c and 11c shown in FIG. 7. The data generating portions 10c and 11c are each composed of gates fewer by one than the number of digits of X address connected in series. The data generating portion 10c is composed of a gate 10a1, an OR gate G1 and a gate G2.

The gate 10a1 ANDs a logic of the most significant digit (XB3) of the data providing X address and an inverted version of logic of the second digit (XB2) from the most significant one. The OR gate G1 ORs a logic of the third digit (XB1) from the most significant one in the data providing X address and a logic of the output of the preceding gate 10a1. The gate G2 ANDs an inverted version of logic of the fourth digit (XB0) from the most significant one in the data providing X address and a logic of the output of the preceding OR gate G1.

Similarly, the data generating portion 11c is composed of a gate 11a1, an OR gate G3 and an AND gate G4. The gate 11a1 ANDs an inverted version of logic of the most significant digit (XB3) in the data providing X address and the logic of the second digit (XB2). The OR gate G3 ORs an inverted version of logic of the third digit (XB1) in the data providing X address and a logic of the output of the preceding gate 11a1. The AND gate G4 ANDs the logic of the fourth digit (XB0) in the data providing X address and a logic of the output of the preceding OR gate G3.

It is possible to properly use the test portions 10b and 11b and the test portions 10c and 11c shown in FIG. 4 and FIG. 7 for realizing the same logic structure with different circuit configurations according to the purpose of use. For example, in the test portion 10b shown in FIG. 4, logics of the data XB3–XB0 are processed in parallel by the gates 10a1 and 10b1. On the other hand, in the test portion 10c shown in FIG. 7, the logics of the data XB3–XB0 are serially processed by the gate 10a1, the OR gate G1 and the gate G2 in this order.

It is seen from the above description that the data generating portions 10b and 11b have higher processing speed than the data generating portions 10c and 11c. However, the data generating portion 10b requires a larger circuit area than the data generating portion 10c because the former processes data in parallel.

Hence, it is recommended that when the processing speed is more important than the circuit area the data generating portions 10b and 11b shown in FIG. 4 be used and when/he circuit area is more important than the processing speed the data generating portions 10c and 11c shown in FIG. 7 be used.

Next, concerning how the circuit configuration is changed when a RAM has a certain number of X addresses and the number of X addresses of the RAM is doubled (when one more shift register is added), its regularity will be described.

Figure 8:
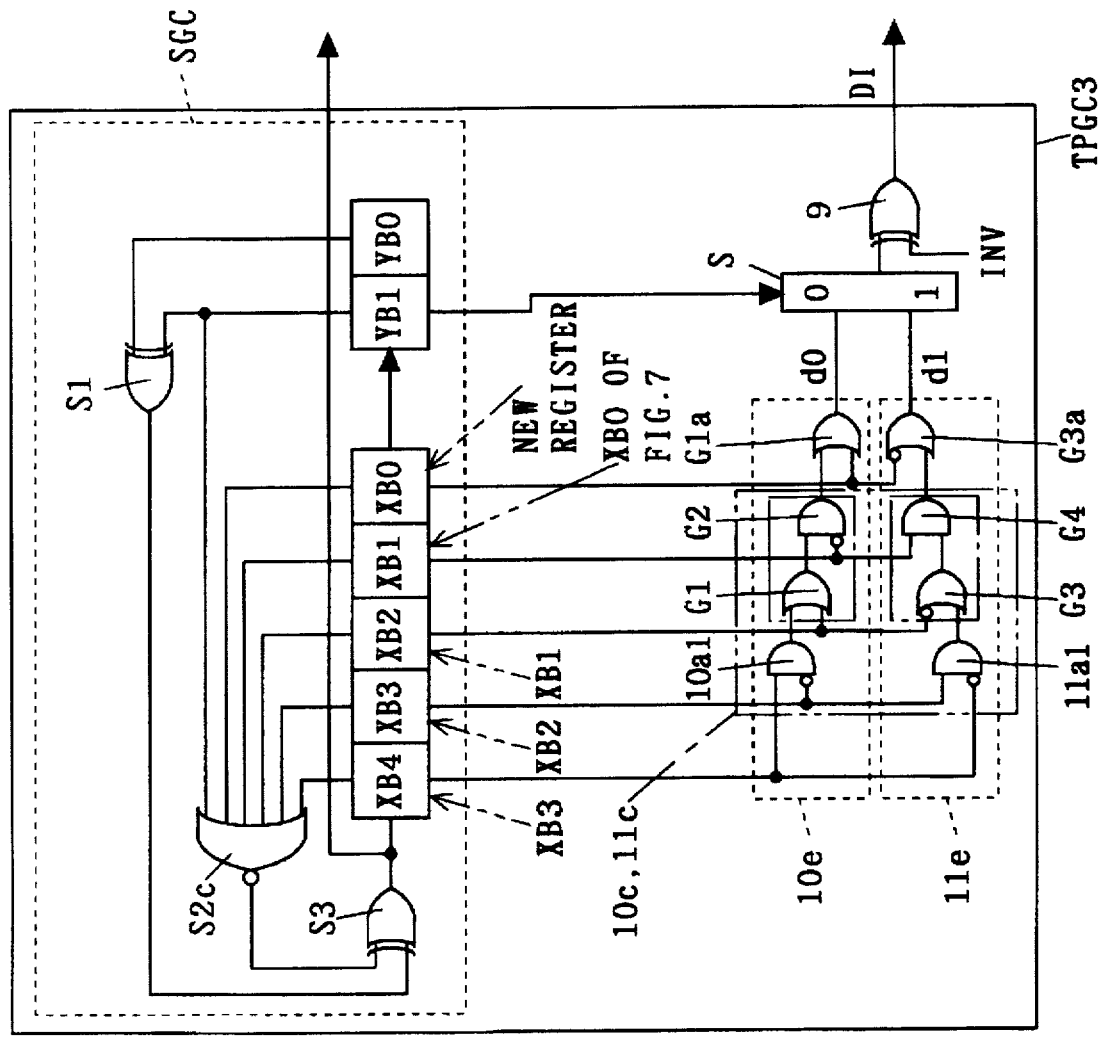
FIG. 8 is a circuit diagram showing a structure of a first example of a third example of the test circuit according to the first preferred embodiment.

FIG. 8 is a circuit diagram illustrating the configuration of data generating portions 10e and 11e for five shift registers XB4–XB0. It is possible to consider that the shift registers XB4–XB1 shown in FIG. 8 correspond to the shift registers XB3–XB0 shown in FIG. 7 and the shift register XB0 is newly connected in series on the low-order side.

For the newly added shift register, an OR gate G1a and a gate G3a are provided in the rear of the data generating portions 10c and 11c to form the data generating portions 10e and 11e. When one more shift register is added, a gate having the same configuration as the gate G2 is further added in the stage following the OR gate G1a and an AND gate is further added to follow the gate G3a.

In the data generating portion 10e, the same configuration as the set including the OR gate G1 and the gate G2 is added for every two additional shift registers. Similarly, in the data generating portion 11e, the same configuration as the set including the gate G3 and the AND gate G4 is further added for every two additional shift registers.

Figure 9:
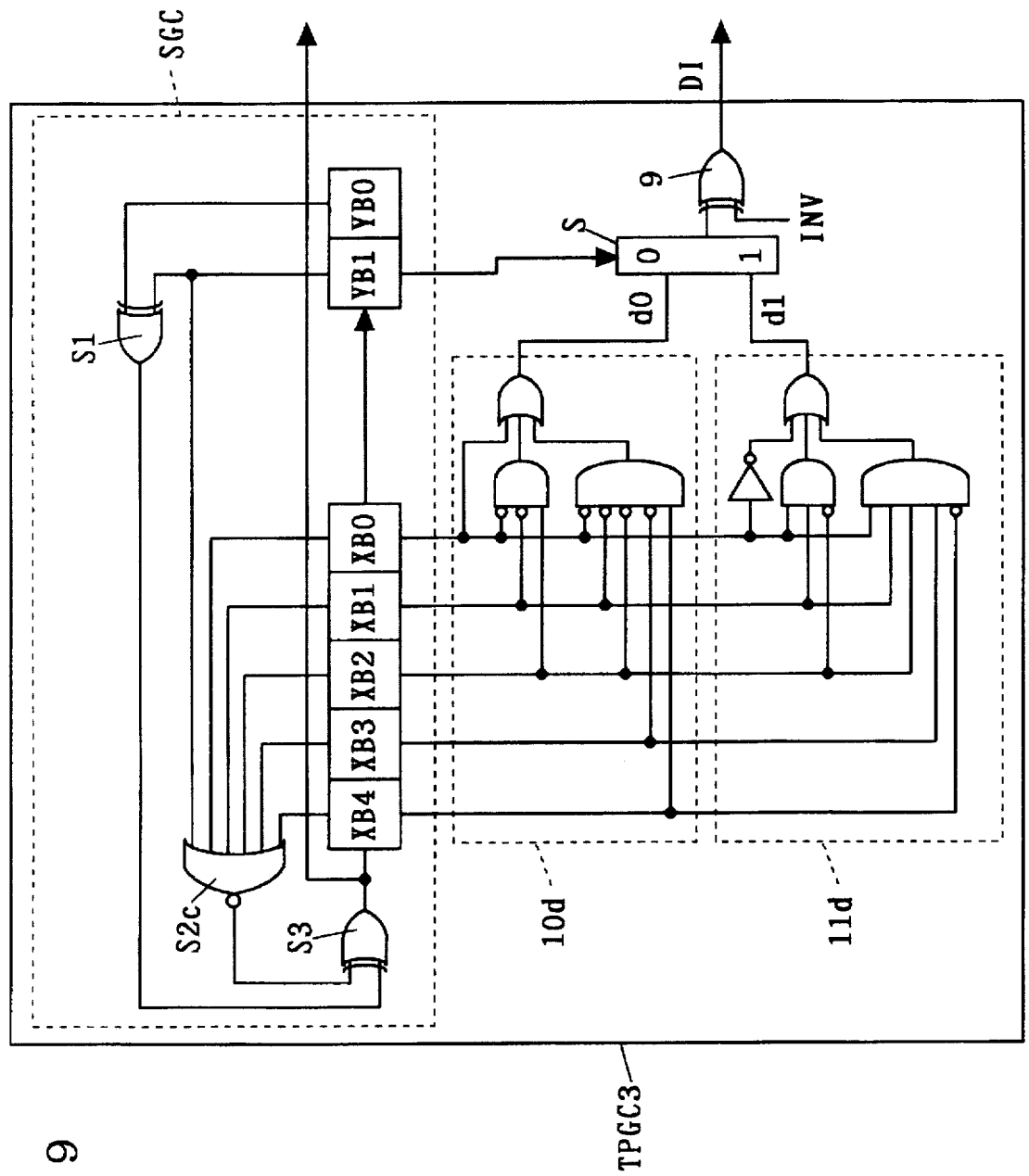
FIG. 9 is a circuit diagram showing a structure of a second example of the third example of the test circuit according to the first preferred embodiment.
Figure 10A:
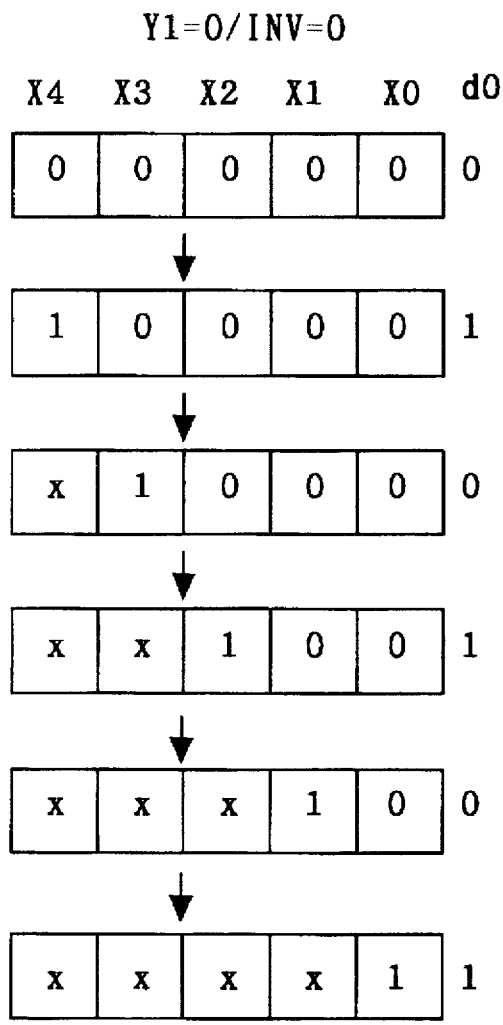
FIGS. 10A and 10B are schematic diagrams showing a third example of the logic structure realized by the test circuit according to the first preferred embodiment.
Figure 10B:
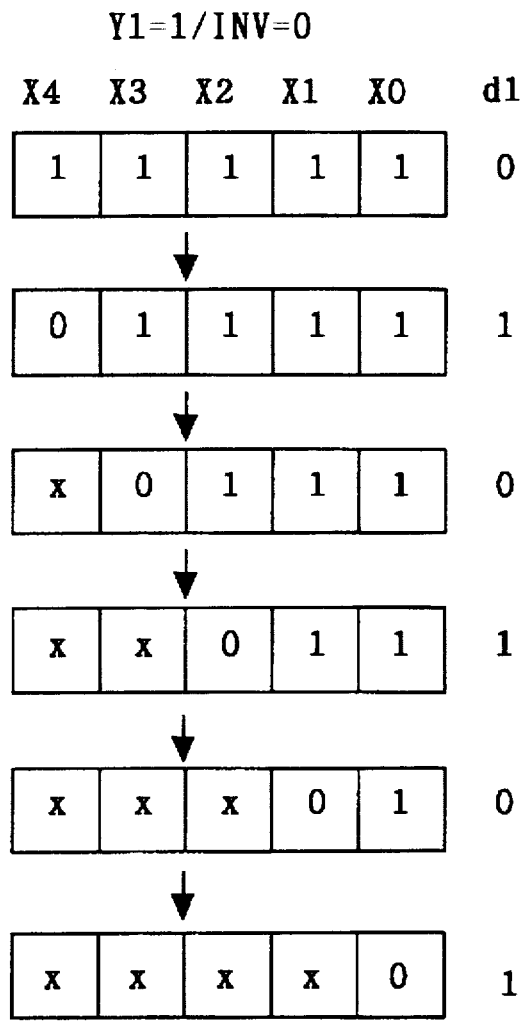

Next, a test pattern generating circuit having parallel circuit configuration will be described. FIG. 9 is a circuit diagram illustrating the structure of a test pattern generating circuit TPGC3 for 5-digit X address. In the structure of the test pattern generating circuit TPGC3, the shift register XB4 is added to the test pattern generating circuit TPGC2 shown in FIG. 4. The circuit shown in this diagram is for realizing the logic structure shown in FIGS. 10A and 10B. FIGS. 10A and 10B are schematic diagrams illustrating data d0 and d1 outputted from the data generating portions 10d and 11d according to data X4–X0.

In the data generating portion 10d, in order to realize the logic structure shown in FIGS. 10A and 10B, data XB0 is inputted to the first input terminal of an OR gate to output "1" as data d0 when data XB0 is "1." The AND of a logic of the data XB2, or the most significant digit in the data XB2–XB0, and inverted versions of logics of the remaining data XB1 and XB0 is inputted to the second input terminal of the OR gate. Furthermore, the AND of a logic of the data XB4 (the most significant digit in the data XB4–XB0) and inverted versions of logics of the remaining data XB3–XB0 is inputted to the third input terminal of the OR gate.

Similarly, in the test portion 11d, the data XB0 is inputted through an inverter to the first input terminal of an OR gate to output "0" as data d0 when the data XB0 is "1." The AND of an inversion of logic of the data XB2 (the most significant bit in the data XB2–XB0) and logics of the remaining data XB1 and XB0 is inputted to the second input terminal of the OR gate. Furthermore, the AND of an inverted version of logic of the data XB4, or the most significant digit in data XB4–XB0, and logics of the remaining data XB3–XB0 is inputted to the third input terminal of the OR gate.

A general logic structure to be realized by the test pattern generating circuit TPGC is shown below. FIG. 11 and FIG. 12 are diagrams illustrating the logic to be realized in the data generating portion 10 and the data generating portion 11. In detail, FIG. 11 illustrates the logic realized by the parallel-configured data generating portions 10 and 11 and FIG. 12 illustrates the logic realized by the serial-configured data generating portions 10 and 11.

The character "m" used in the drawings represents a bit number of the most significant one of the shift registers X for X address. The bit number is a number provided after the reference character X for shift registers. (For example, the bit number of "X3" is 3.) Similarly, "n" represents a bit number of the most significant one of the shift registers Y for Y address.

Logics of the data d0 and d1 respectively outputted from the data generating portions 10 and 11 can be classified into two kinds depending on whether m is an even number or an odd number. Since the bit number starts from "0", the number of shift registers X is odd when m is an even number and the number of the shift registers X is even when m is an odd number.

As has been described referring to FIG. 6, since either of the OR gates 10or and 11or and the NOR gates 10nor and 11nor can be used, the data d0 and d1 each have two types of logics when m is an odd number and two types of logics when m is an even number.

Next, the basis of the logic structure of this preferred embodiment will be described in detail. In the circuit shown in FIG. 1, values stored in the shift registers X1, X0, Y1 and Y0 specify address of the RAM 1. The algorithm for generating the test pattern is realized and input data DI is generated and written in the RAM 1.

The pseudo-random number that the EX-OR gate S3 generates in the tth turn according to the logic stored in the LFSR circuit is assumed to be a pseudo-random number L(t). Generation of the pseudo-random number L(t+1) causes the pseudo-random number L(t) to shift one bit in the LFSR circuit and "0" or "1" is inputted as the pseudo-random number L(t+1) to the most significant bit of the LFSR circuit.

The X address of the memory cell which is accessed immediately before the memory cell at address "$A_{x1}\ A_{x2}\ 0\ 1$" is "$A_{x2}\ 0$". Considering that the bit line bit1 is selected by the Y address "0 1", detecting a fault in the memory cell at the address "$A_{x1}\ A_{x2}\ 0\ 1$" in which "1" is stored requires that "0" be stored in the memory cell at the address "$A_{x2}\ 0\ 0\ 1$." Then when the memory cell at the address "$A_{x1}\ A_{x2}\ 0\ 1$" is read, the logic on the bit line bit1 changes from "0" to "1" in normal operation.

This way, data is written into the RAM in such a generation pattern that a logic is swung from one logic to the other on one of the bit lines bit0–bit3 which is selected when address data changes. Such a data pattern can be created on the basis of the pattern of address data shifting bit by bit that is generated by the all cycle sequence generating circuit.

It is assumed, as shown in FIG. 4, that the scan path SP for supplying address data to the RAM 1 is formed in the order: scan-in terminal → shift register XA3 → shift register XA2 → shift register XA1 → shift register XA0 → shift register YA1 → shift register YA0 → scan-out terminal.

The data set in the shift register X3 in the time after the clock signal which is referred to with the number t in order and before the clock signal which is referred to with the number t+1 in order is referred to as data X3(t). Other data are referred to in the same manner as well. The address X(t) shows address data formed of data X3(t)–X0(t).

Consider the case where the address data changes from address X (t–1), Y (t–1) to address X(t), Y(t). At this time, a logic on each bit line changes from a value held in a memory cell specified by address X(t–1) to a value held in a memory cell specified by address X(t).

Consider the case in which, with the tth clock signal, $$X(t)="1\ 1\ 0\ 0"\ldots \quad (1)$$

With the previous clock signal, i.e., with the t–1th clock signal, the address data was $$X(t-1)="1\ 0\ 0\ 0"\ldots \quad (2)$$

or $$X(t-1)="1\ 0\ 0\ 1"\ldots \quad (3)$$

Whether it was the data expressed by the equation (2) or (3) can be known by referring to the value of the data Y1(t). This is because the data X0(t−1) shifts with the clock signal to become the data Y1(t). It is shown in FIG. 13.

As shown in FIG. 13, address data is updated every time the data shifts. When writing in and reading from the RAM 1 in the order of the same pattern of address data, switching "0" and "1" of the data d0 and d1 as the address data is updated causes a logic of data on a bit line to swing from "0" to "1" or from "1" to "0". It is shown in FIGS. 5A and 5B.

In FIG. 5A, d0=0 when X="0000", and then the value of the data d0 is inverted every time address data shifts one bit. In FIG. 5B, d1=0 when Y1=1 and X="1111", and then the value of the data d1 is inverted every time the address data shifts one bit. One of the data d0 and d1 is outputted as data DI according to whether data Y1 is "0" or "1", as shown in FIG. 1. This makes it possible to properly swing a logic to the other side on a bit line on the basis of the reason provided below.

For example, when only the data d0 shown in FIG. 5A is used, a logic supplied to the bit line from the memory cell specified by address X(t) may be the same as a logic provided to the bit line from the memory cell specified by address X(t+1).

It will now be described in an example of address "0001__10" surrounded by the broken line in the twelfth line from the top in Table 4. This address selects the bit line bit2. When only the data d0 is used, "0" is written as shown in FIG. 5A into the memory cell at address "0001__10" according to the value of data d0. On the other hand, as shown in Table 4, as to address "0011__00" one line above the address "0001__10", the bit line bit2 is supplied with "0." The bit line bit2 then continuously holds "0" and a fault in the memory cell at address "0001__10" can not be found, resulting in lower reliability of the test.

In the present invention, however, switching data d0 and data d1 with the selector S changes the value held on the bit line bit2 from "0" to "1", as shown in Table 4. Then a fault in the memory cell is properly found.

The reason why the data d0 and d1 are switched with the data (Y1), the most significant digit of Y address, will be described in an example of reading from the To facilitate the description, it is assumed that the first value of data Y1 is "".

State 1: When several (including 0) "1"s continue from the least significant digit of X address data, this number of "1"s are continuously provided to Y1. Accordingly, as illustrated in FIG. 10B, on the bit lines which may be connected to the output terminal of the RAM because the logic of the most significant digit of Y address is "1" (the bit lines corresponding to Y address data "10" and "11"), a data inversion state continues in which "1" and "0" in inverted relation are alternately provided for each clock signal.

State 2: Suppose that "1" continuing in State 1 is interrupted and the address data has become "xxx0__1x". Then since the value of the data Y1 is still "1", on the bit lines which correspond to the logic "1" in the most significant digit of Y address, data with inverse logic to the data in the memory cell which was provided last in State 1 is provided from another memory cell. On the bit lines which are not connected to the output terminal of the RAM because the logic of the most significant digit of Y address is "0", since the logic of the least significant digit of X address is "0", it can be considered that preparation is made for continuing the data inverted state from this State 2.

State 3: A "0" is provided as data Y1 and the address data becomes "xxxx__01". Then a bit line corresponding to Y address having "0" on the most significant digit is connected to the output terminal of the RAM. As "0" is applied as data Y1 when the data shifts one bit in the shift registers, the number of continuing "0"s changes in the shift registers. On the bit lines which may be connected to the output terminal of the RAM, the value changes from "0" to "1" or from "1" to "0". This data inverted state continues until "1" is provided to data Y1 next. When "1" is applied to data Y1, it comes in State 1 again and State 1 State 3 are repeated till the end of the test.

As is clear from the description above, it is understood that switching output of the selector S according to a value of data Y1 causes a logic on a bit line connected to the output terminal of the RAM to swing from one logic to the other.

As shown in Table 2 and Table 4, even if the test pattern generating circuit of the present invention is used, a fault can not be properly found in some X addresses having continuous "0"s or "1"s. Such X addresses include "00", "11" (Table 2), "0000" and "1111" (Table 4), for example. An improvement can not be achieved in fault detection at these addresses for the reason given below.

For example, if X address is "0000" with the tth clock signal, the two kinds of X addresses and Y addresses shown in FIG. 14 are naturally expected for the t+1th clock. As can be understood from the diagram, the possibility of "0" located in the head of X address is equal to that of "1". That is to say, the X address takes "0000" or "1000" with a ½ possibility.

As is seen from this example, in X address having continuous "0"s or "1"s, the address X(t) and the address X(t−1) are the same with a possibility of ½. At this time, on a certain bit line, the same memory cell is selected over two clock signals that are continuously applied. That is to say, the logic on the bit line can not be inverted. As long as the RAM is tested using a scan path formed of shift registers, that is to say, as long as a random-number generating circuit using shift registers is used, it is impossible to make improvement in addresses "00 . . . 00" and "11 . . . 11".

It is possible to invert the data d0 and d1 between "0" and "1" by switching value of the data inversion signal INV, in which case it is impossible to make improvement at addresses "00 . . . 00" and "11 . . . 11" as well.

This preferred embodiment has disclosed a method of generating a test pattern which enables proper fault detection in a RAM by swinging logic to the other side on a selected bit line and the circuit configuration for generating the pattern. The generation pattern of the all cycle sequence used in test is the same in the conventional one and the preferred embodiment, where only one cycle of generation of the all cycle sequence is enough. This does not increase the test time and therefore the test method of the preferred embodiment is extremely helpful.

The description made above has shown a RAM having memory cells as many as 2 to the number of address-specifying shift registers power. More specifically, in the examples, when it has N shift registers in total for X address and Y address, the RAM 1 of the example has $2^N$ memory cells. However, the present invention is not limited to it but can be applied to a RAM having memory cells of the number other than $2^N$.

Second Preferred Embodiment

Figure 15:
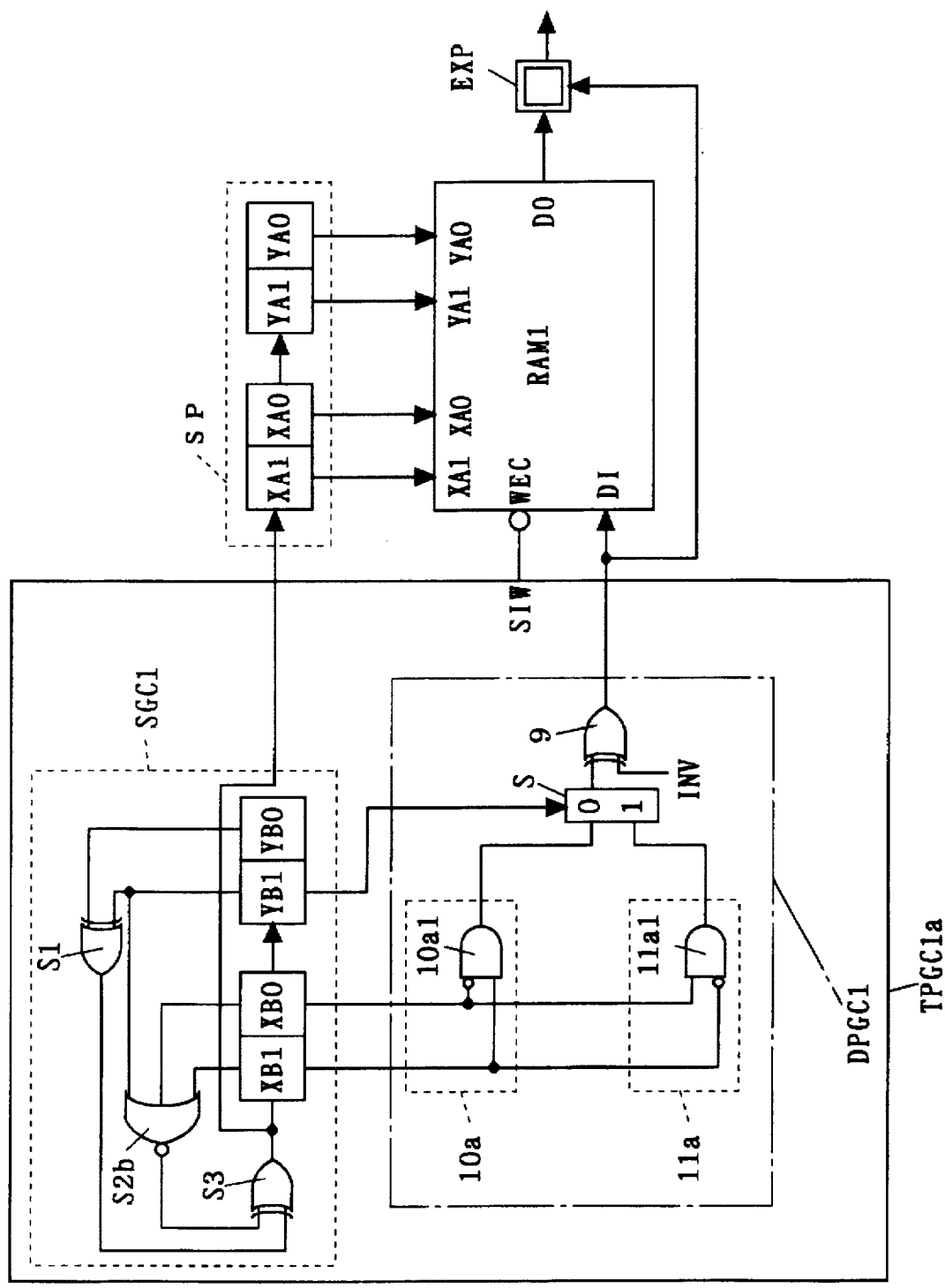
FIG. 15 is a circuit diagram illustrating a structure of a test circuit according to a second preferred embodiment.

The same components and constituents already described are shown with the same reference characters and not described again. FIG. 15 is a circuit diagram illustrating the structure of a test circuit according to this preferred embodiment.

In the circuit shown in FIG. 15, the circuit shown in FIG. 1 further includes a comparison circuit EXP having its first input terminal connected to the data output terminal of the RAM 1 and its second input terminal connected to the data input terminal DI of the RAM 1. The comparison circuit EXP is realized with an EX-OR gate, etc. The input terminal WEC to which the write enable signal WEC is inputted, which is not shown in the figures in the first preferred embodiment, is used in this preferred embodiment. FIG. 15 does not show memory cells of the RAM1.

The shift registers XB1, XB0, YB1 and YB0 of the test pattern generating circuit TPGC1a and the shift registers XA1, XA0, YA1 and YA0 of the scan path circuit SP form pairs in this order. With this structure, data DI written into the RAM 1 and data DO outputted from a normal RAM 1 are equal to each other about specific address data provided by data X1, X0, Y1 and Y0.

Controlling logic of the write enable signal WEC utilizing the features above allows the test pattern generating circuit TPGC1a to generate expected values of data DO. The write enable signal WEC is inputted from an output terminal SIW of the test pattern generating circuit. The algorithm for testing the RAM 1 using the test pattern generating circuit TPGC1a is as follows.

1. By setting as WEC(SIW)=0, write of data into memory cells of the RAM 1 is enabled. In this state, test pattern is outputted into the RAM 1 according to the algorithm shown in the first preferred embodiment.

2. By setting as WEC(SIW)=1, data write into memory cells of the RAM 1 is disabled. In this state, test pattern is outputted from the test pattern generating circuit TPGC1a into the comparison circuit EXP according to the algorithm shown in the first preferred embodiment. At this time, the comparison circuit EXP compares data stored in memory cells MC specified by address data formed of data X1, X0, Y1 and Y0 and data from the test pattern generating circuit TPGC1a. By observing the results of the comparison in the comparison circuit EXP, faults in the RAM 1 are easily found.

The use of the test pattern generating circuit of this preferred embodiment enables generation of test pattern written into the RAM and expected values of data outputted from the RAM. This eliminates the necessity of separately providing a circuit for providing data expected values. As it does not increase the area of the circuit used to test the RAM, the test pattern generating circuit according to this preferred embodiment is extremely effective to highly integrated semiconductor devices.

Third Preferred Embodiment

Figure 16:
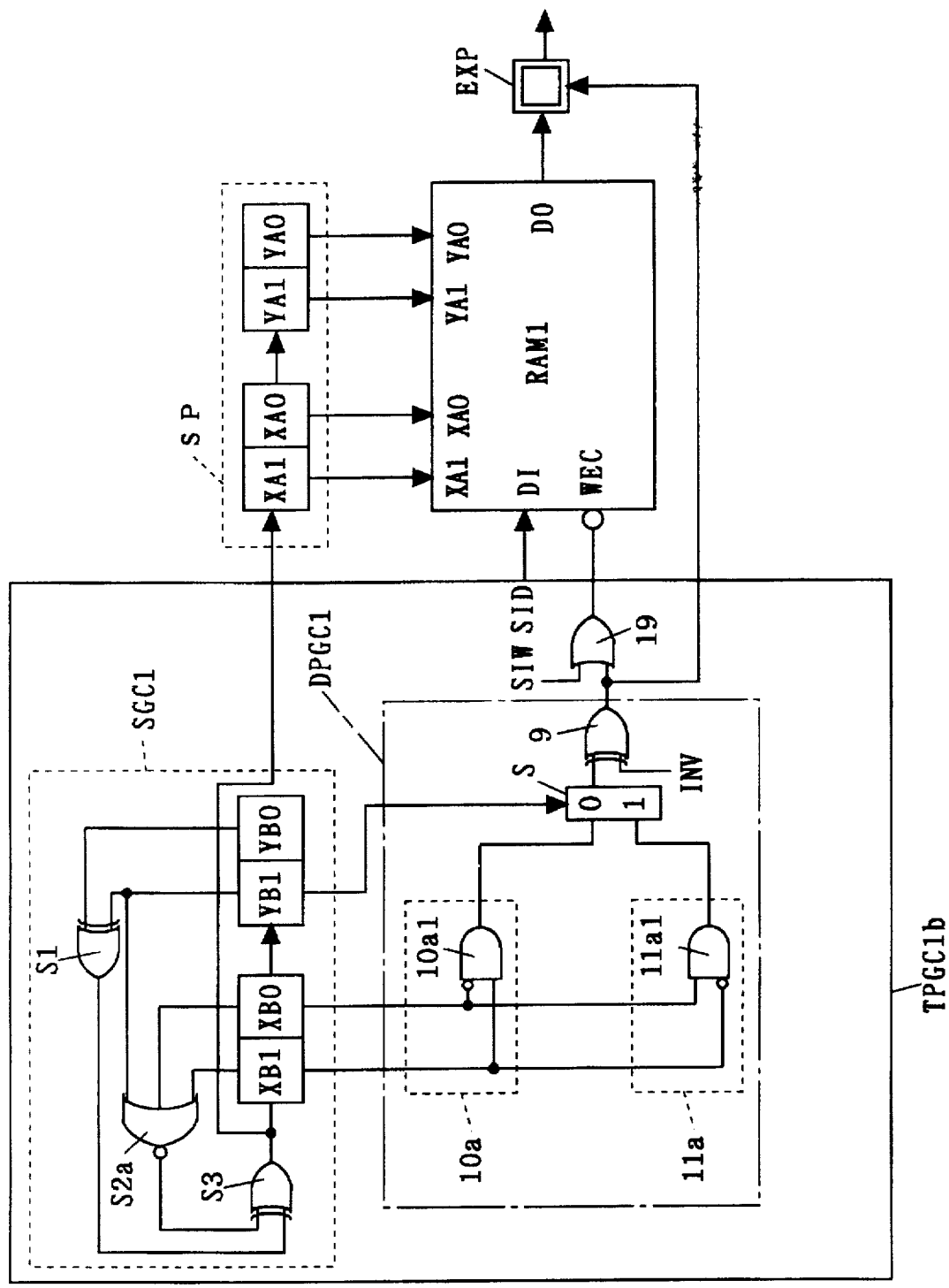
FIG. 16 is a circuit diagram illustrating a structure of a test circuit according to a third preferred embodiment.

FIG. 16 is a circuit diagram illustrating the structure of a test pattern generating circuit TPGC1b according to this preferred embodiment. The test pattern generating circuit TPGC1b shown in the figure is characterized in that the output terminal of the EX-OR gate 9 of the test pattern generating circuit TPGC1a shown in FIG. 15 is connected to the input terminal WEC of the RAM 1 through an OR gate 19. In other respects, the structures are the same in the circuits shown in FIG. 16 and FIG. 15.

That is to say, the all cycle sequence generating circuit SGC1 and the data pattern generating circuit DPGC1 of the test patten generating circuit TPGC1a have the same configurations as the all cycle sequence generating circuit SGC1 and the data pattern generating circuit DPGC1 of the test pattern generating circuit TPGC1b without any change. The comparison circuit EXP is connected to the data output terminal DO of the RAM 1.

The output of the data pattern generating circuit DPGC1 is inputted to one input terminal of the OR gate 19 and to the second input terminal of the comparison circuit. The other input terminal of the OR gate 19 is supplied with a switch signal SIW. The switch signal SIW is a name used in this preferred embodiment to refer to a signal applied from an output terminal SIW which supplies the write enable signal WEC in the second preferred embodiment. The data input terminal DI of the RAM 1 is supplied with data DI from an output terminal SID of the test pattern generating circuit TPGC1b. In this preferred embodiment, data DI is supplied by the same system as the write enable signal WEC in the second preferred embodiment.

The test method of the RAM of this preferred embodiment is characterized in the following points: (1) first, in the first cycle, one logic is written only into memory cells write-enabled by the write enable signal WEC, and (2) in the second cycle, the other logic is written into all the memory cells that data were not written into in the first cycle. According to this method, test pattern can be written into memory cells similarly to the first and the second preferred embodiment. Similarly to the second preferred embodiment, it is also possible to generate expected values of the output DO with the test pattern generating circuit TPGC1b.

The algorithm for writing in testing the RAM 1 using the test pattern generating circuit TPGC1b of this preferred embodiment is as follows.

Operation 1: Signals are set as DI(SID)=0, INV=0 and SIW=0. The test pattern generating circuit TPGC1b is operated with the signals thus set. In the first cycle, all patterns of address data are generated by the all cycle sequence generating circuit SGC1.

With this circuit operation, a logic "0" of input data DI is written into memory cells in the RAM 1 with WEC=0 when their addresses are specified.

Operation 2: Signals are set as DI(SID)=1, INV=1 and SIW=0. With the signals thus set, the test pattern generating circuit TPGC1b is operated. Similarly to the first cycle, all patterns of address data are generated as the second cycle by the all cycle sequence generating circuit SGC.

With this circuit operation, a logic "1" of input data DI is written into memory cells of the RAM 1 with WEC=1 when their addresses are specified.

The input data DI and the data inversion signal INV are differently set in the first cycle and the second cycle. The logic of the write enable signal WEC supplied by the data pattern generating circuit DPGC1 and the all cycle sequence generating circuit SGC1 is made inverse to that in the first cycle by the data inversion signal INV. Accordingly, the memory cells that were not write-enabled in the first cycle are write-enabled with WEC=1. As the input data DI is inverse to that in the first cycle, logics in the memory cells written in the first cycle and logics of the memory cells written in the second cycle are inverse to each other.

Operation 1 and Operation 2 explained above write the same test pattern as that in the first and second preferred embodiments into the memory cells. The algorithm for generating expected values of the output data DO using the test pattern generating circuit TPGC1b when testing the RAM 1 is as follows.

Operation 3: The signals are set as INV=1 and SIW=1. With the signals set this way, the test pattern generating circuit TPGC1b is operated. Then the test pattern generating circuit TPGC1b (1) provides "0" as expected values of output data DO for the memory cells into which "0" has been written in Operation 1, and (2) provides "1" as expected values of output data DO for the memory cells into which "1" has been written in Operation 2.

The comparison circuit EXP compares the output data DO from the RAM 1 and the expected values from the test pattern generating circuit TPGC1b. Observing the comparison enables detection of faults in the RAM 1. Next, a difference between the test method of the second preferred embodiment and the test method of this preferred embodiment will be described.

Figure 17:
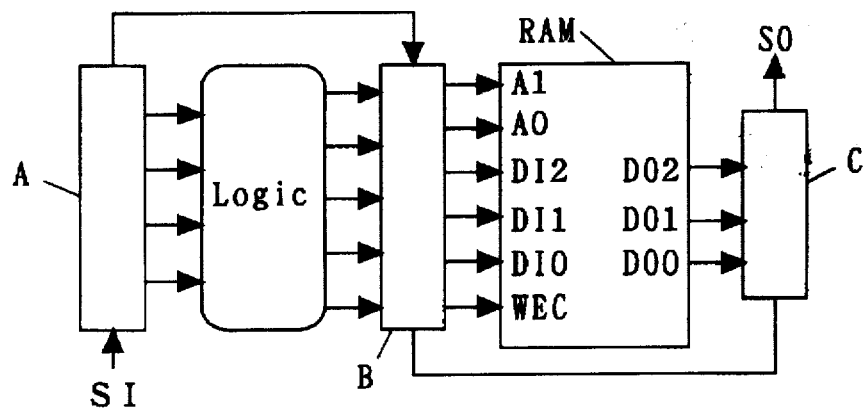
FIG. 17 is a circuit diagram illustrating a structure of the scan path circuit.

FIG. 17 is a circuit diagram illustrating the circuit structure for a usual scan path test. Circuits A, B and C are provided at the input portion of the logic portion, between the output portion of the logic portion and the input portion of the RAM and at the output portion of the RAM, respectively. The scan path is formed of the circuits A, B and C.

Figure 18:
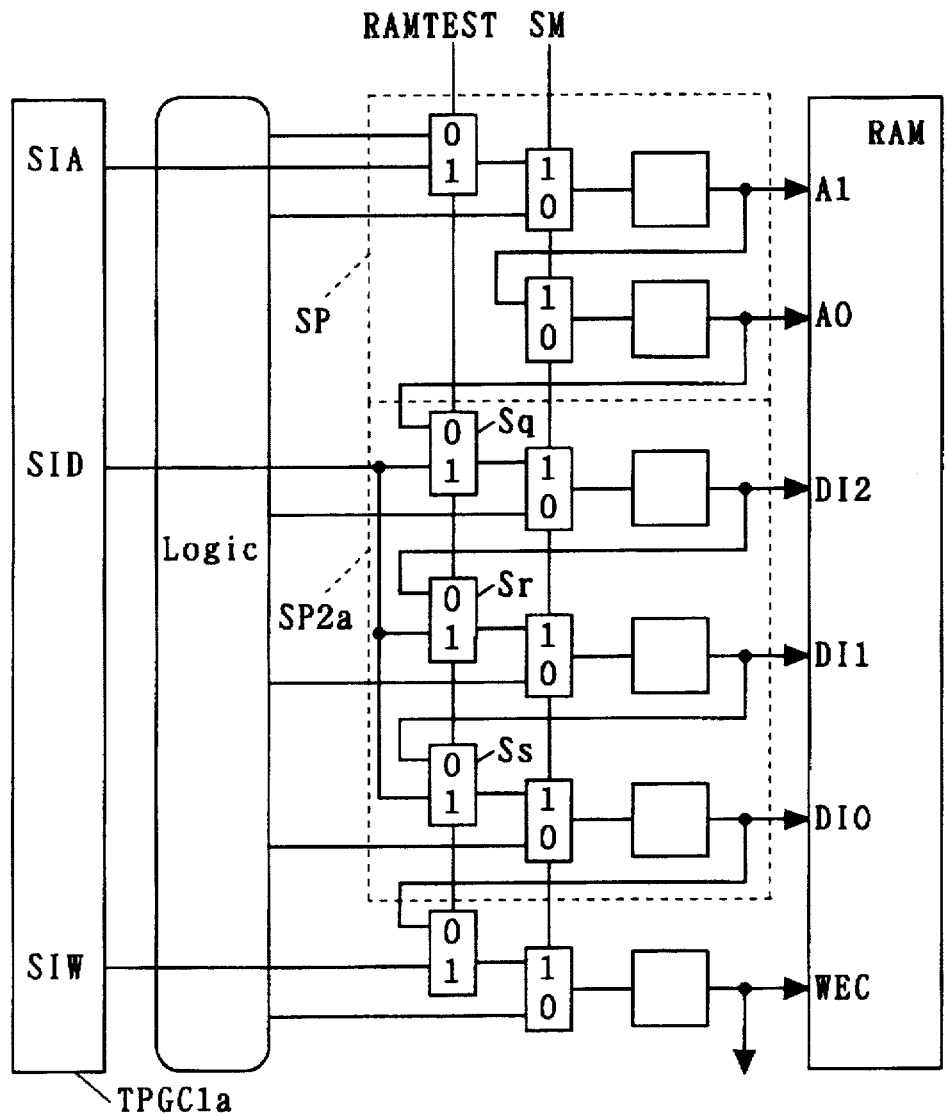
FIG. 18 is a circuit diagram illustrating a structure of the test circuit according to the second preferred embodiment.
Figure 19:
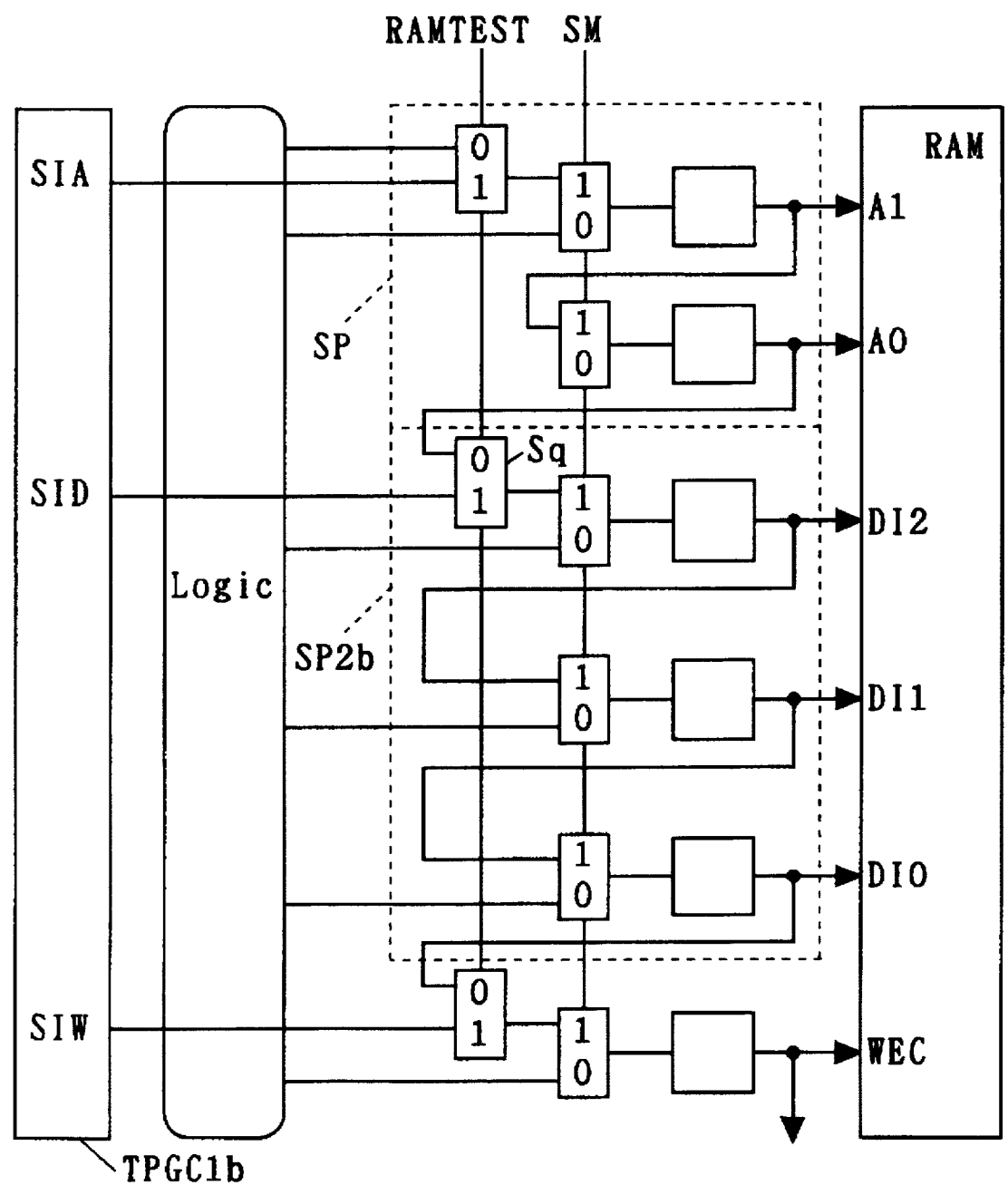
FIG. 19 is a circuit diagram illustrating the structure of the test circuit according to the third preferred embodiment.

FIG. 18 and FIG. 19 are circuit diagrams illustrating the circuit structures for the test method of the second preferred embodiment and that of this preferred embodiment, respectively. In FIG. 18, the circuit B shown in FIG. 17 is divided, which are utilized as the scan path circuit SP shown in FIG. 1 and the scan path circuit SP2a for input data DI.

The RAM 1 shown in FIG. 16 has only one data input terminal DI. However, this invention may be used for a RAM having a plurality of inputs (DI2, DI1, DI0) as shown in FIG. 18 and FIG. 19. In this case, the data input portion of the RAM requires a scan path circuit in order to deal with the plurality of inputs. The scan path circuits SP2a and SP2b respectively shown in FIG. 18 and FIG. 19 are used as the scan path circuit.

The scan path circuit SP2a includes selectors Sq, Sr and Ss. The data SIA is address data. In FIG. 19, the circuit B shown in FIG. 17 is divided and used as the scan path circuit SP and the scan path circuit SP2b for input data DI in testing the RAM. The scan path SP2b includes a selector Sq.

In the test method of the second preferred embodiment, the test pattern written into memory cells changes for each address. Hence, it requires the selectors Sq, Sr and Ss respectively corresponding to the data input terminals DI2, DI1 and DI0. On the other hand, in the test method of this preferred embodiment, data is written into the RAM by controlling the write enable signal WEC with the input data DI fixed. In the scan path SP2b, "0" or "1" is initially set. Since the input data DI is fixed, it is sufficient to include one selector Sq for the data input terminals DI2, DI1 and DI0.

As is clear from the description on the algorithm in writing, circuit operation for one cycle is enough to write the test pattern into memory cells of the RAM in the test method of the second preferred embodiment. On the other hand, the test method of this embodiment requires circuit operation for two cycles. Accordingly, the test of this preferred embodiment requires a time twice that of the test method of the second preferred embodiment in order to write the test pattern.

As is understood referring to FIGS. 17 to 19, however, the circuit configuration of this preferred embodiment is closer to the circuit configuration used in scan path test than the circuit configuration of the second preferred embodiment. In more detail, the scan path circuit SP2b shown in FIG. 19 requires a smaller number of selectors than the scan path SP2a shown in FIG. 18. This allows a reduction in circuit scale of a semiconductor device having the test pattern generating circuit having the circuit configuration of this preferred embodiment.

Fourth Preferred Embodiment

Figure 20:
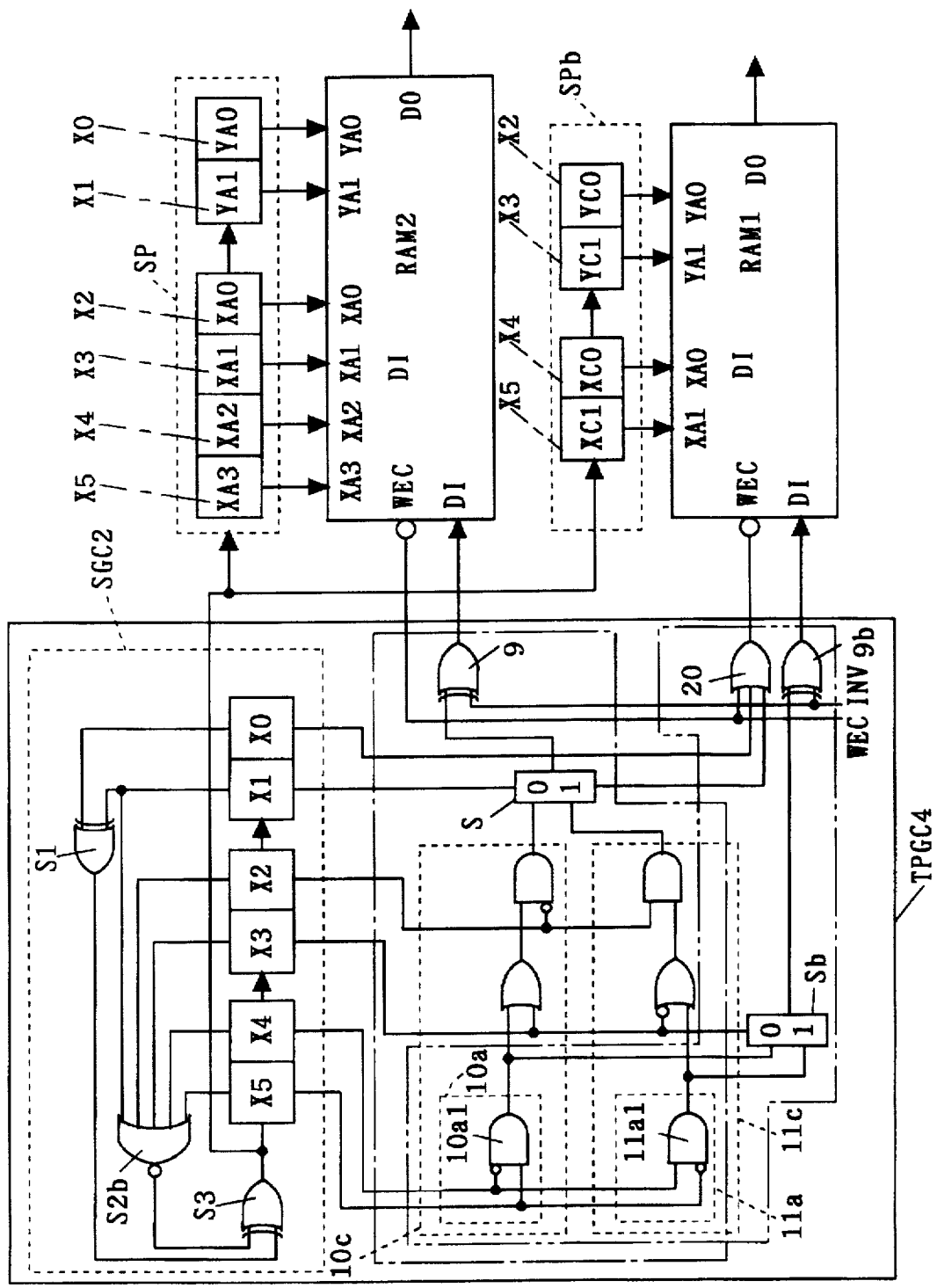
FIG. 20 is a circuit diagram illustrating the structure of a test circuit according to a fourth preferred embodiment.

This preferred embodiment discloses the structure of a test pattern generating circuit which can simultaneously test a plurality of RAMs having different numbers of words. FIG. 20 is a circuit diagram illustrating the structure of a test pattern generating circuit TPGC4 according to this preferred embodiment. The test pattern generating circuit TPGC4 includes further circuitry in addition to the test pattern generating circuit TPGC2 for the RAM 2 having 16 rows×4 columns shown in FIG. 7. In order to facilitate understanding, the shift registers XB3–XB0 and YA1, YA0 in FIG. 7 are referred to as shift registers X5–X0 in FIG. 20. Now, the additional circuitry will be described.

In order to deal with the RAM 1 of four rows×four columns which is an object of the test pattern generating circuit TPGC4, a scan path SPb is added for supplying address data to the RAM 1. The scan path SPb includes shift registers XC1, XC0, YC1 and YC0 connected in series in order. The input terminal of the shift register XC1 is connected to the input terminal of the shift register X5. With this structure, data X5–X2 in the shift registers X5–X2 are equal to data XC1, XC0, YC1 and YC0 in the shift registers XC1, XC0, YC1 and YC0, respectively. The data X5–X0 are the same as the data XA3–XA0, YA1 and YA0 in the scan path SP, respectively.

A selector Sb having its control terminal connected to the shift register X3 and its data input 0 and 1 terminals respectively connected to the output terminals of the gates 10a1 and 11a1 is provided in order to simultaneously. test the RAM 1 with the RAM 2. The output terminal of the selector Sb is connected to one input terminal of an EX-OR gate 9b having its other input terminal connected to the data inversion signal INV. The output terminal of the EX-OR gate 9b is connected to the data input terminal DI of the RAM 1.

In the RAM 1, logic of the low-order two digits in the 6-digit address data provided by data X5–X0 are not considered. If the data X5–X0 provide address data "000000" and "000001", for example, both of them are recognized as address data "0000".

For the reason given above, data is written into the same memory cell of the RAM 1 four times when the all cycle sequence generating circuit SGC2 generates the all cycle sequence and supplies address data. Therefore an OR gate 20 is provided so that data is written into an arbitrary memory cell included in the RAM 1 only once in each test.

The OR gate 20 is supplied with the write enable signal WEC and data X1 and X0. The output terminal of the OR gate 20 is connected to the input terminal WEC of the RAM 1. With this structure, data is written into the memory cells only when the RAM 1 is write-enabled by the write enable signal (WEC=0) and both data X1 and X0 are "0".

In the test pattern generating circuit TPGC4 shown in FIG. 20, the part surrounded by the one-dot chain line supplies test pattern to the RAM 2, which corresponds to the part shown by the one-dot chain line in FIG. 7. The part surrounded by the two-dot chain line supplies test pattern to the RAM 1, which corresponds to the data pattern generating circuit DPGC1 shown in FIG. 1 plus the OR gate 20.

The operation of writing test pattern into the RAM 1 and RAM 2 has been described above. When reading data from the memory cells of the RAM 1 and the RAM 2, the all cycle sequence is generated by the all cycle sequence generating circuit SGC2 while inhibiting write by setting the write enable signal WEC to "1".

With this structure, data can be simultaneously written into all memory cells of the RAM 1 and the RAM 2 with one test pattern generating circuit TPGC4. It is accomplished as the all cycle sequence generating circuit SGC2 included in the test pattern generating circuit TPGC4 generates the all cycle sequence. This eliminates the necessity of providing circuitry for generating all cycle sequence for each of the RAM 1 and RAM 2. The RAM 1 and RAM 2 share the circuitry for generating the test pattern in the test pattern generating circuit TPGC4. Accordingly, a plurality of RAMs can be tested at the same time without considerably increasing the circuit area.

The case is considered in which a plurality of RAMs are tested using the test pattern generating circuit TPGC2 having the data generating portions 10b and 11b with parallel structure in FIG. 4. The test pattern generating circuit TPGC2 can test only the RAMs which have X addresses of 2 to the even number power. Testing a RAM having X addresses of 2 to the odd number power requires another circuitry having the same structure as the data generating portions 10d and 11d shown in FIG. 9.

When using the test pattern generating circuit TPGC4 having the data generating portion with series structure as shown in FIG. 20, however, it is possible to test a plurality of RAMs having X addresses of 2 to the even number power and 2 to the odd number power without providing a specific data generating portion.

Fifth Preferred Embodiment

The first to fourth preferred embodiments have shown methods of testing RAMs using a test patten generating circuit. However, the effects of the present invention can be obtained by supplying such test pattern as would cause logic on bit lines of the RAM to swing from one to the other with address data, instead of specially using a test patten generating circuit.

When a microprocessor is provided on a chip, storing address data and test pattern, which are generated by the test pattern generating circuit TPGC, in the microprocessor will allow the microprocessor to generate the address data and test pattern in a software manner, eliminating the necessity of providing a test pattern generating circuit on the chip.

Figure 21:
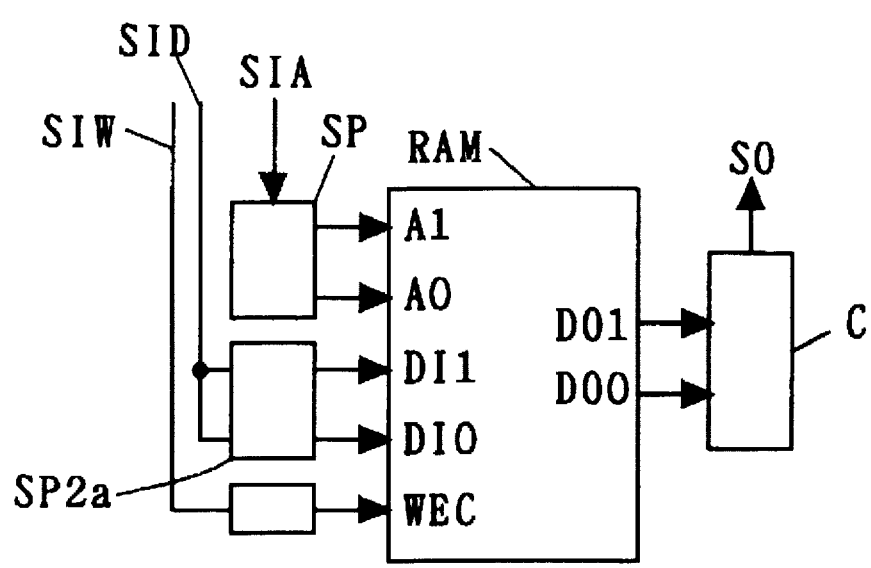
FIG. 21 is a circuit diagram illustrating the structure of a test circuit according to a fifth preferred embodiment.

For example, the structure described above can be realized by storing address data and test pattern in the logic portion shown in FIG. 17. When the RAM is connected to an external input/output terminal, address data and test pattern may be applied from a tester separate from the chip on which the RAM is provided. FIG. 21 is a schematic diagram illustrating the test method according to which data is supplied from an external tester.

According to this preferred embodiment, the circuit scale of a semiconductor integrated circuit can be reduced for the area for provision of the test pattern generating circuit.

Sixth Preferred Embodiment

FIG. 22 is a circuit diagram showing a RAM 3 having 8 columns in place of the RAM 2 having 4 columns shown in FIG. 7. The shaded memory cells of FIG. 22 are written with "1", and the blank memory cells are written with "0". The scan path SP illustrated in FIG. 22 further includes a shift register YA2 inserted between the shift registers XA0 and YA1 of the scan path SP illustrated in FIG. 7 in accordance with a twofold increase in the number of columns for the Y address.

A Y decoder YD 1 decodes the data stored in the shift registers YA2-YA0 to provide a binary number, and bit lines bita0-bita7 of the RAM 3 are selected in accordance with the binary number. The bit lines bita0-bita7 of the RAM 3 are arranged in this order and correspond to the respective Values of the binary number provided by the Y decoder YD1 which are arranged in ascending numeric order.

Such a construction allows the bit lines bita0-bita7 to be selected by the Y address in a direction in which the bit lines bita0-bita7 are arranged. Then, the direction in which the bit lines bita0-bita7 are arranged matches the direction in which the Y address selects the bit lines bita0-bita7.

Figure 23:
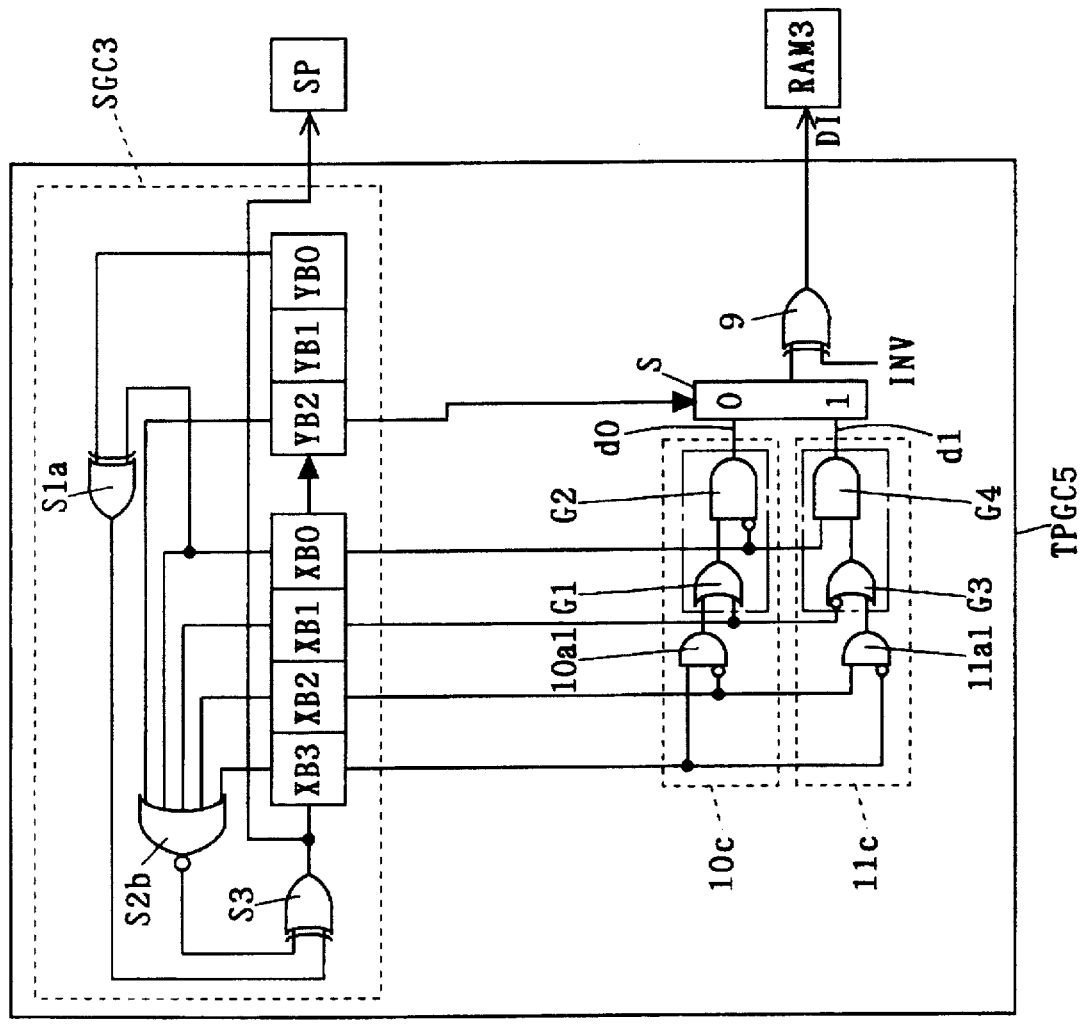
FIG. 23 is a circuit diagram illustrating a structure of a test circuit for writing data on the basis of the regularity according to the first to fifth preferred embodiments.

FIG. 23 is a circuit diagram of a test pattern generating circuit TPGC5 for providing a test pattern to the RAM 3 shown in FIG. 22. An all cycle sequence generating circuit SGC3 illustrated in FIG. 23 further comprises a shift register YB2 inserted between the shift registers XB0 and YB1 of the circuit shown in FIG. 7 in accordance with the provision of the shift register YA2 to be paired therewith.

The all cycle sequence generating circuit SGC3 comprises an EX-OR gate S1a for exclusive-ORing the data XB0 and YB0 in place of the EX-OR gate S1 illustrated in FIG. 7 since address data becomes 7-bit data by the provision of the shift registers YA2 and YB2. The selection of the shift registers storing the data to be applied to the EX-OR gates S1 and S1a is made on the basis of the known regularity for the all cycle sequence generating circuit.

There are no differences in X address between the RAM 3 of FIG. 22 and the RAM 2 of FIG. 7. The test pattern generating circuit TPGC5 of FIG. 23 comprises the data generating portions 10c and 11c of FIG. 7. The same connections between the data generating portions 10c, 11c and the shift registers XB3-XB0 are made as illustrated in FIGS. 23 and 7 because of no differences in X address. Then, the data d0 and d1 outputted respectively form the data generating portions 10c and 11c are determined only by the data XB3-XB0.

On the other hand, the switching between the outputs from the data generating portions 10c and 11c is done by the data YB2 as illustrated in FIG. 23. Thus, the data generating portion 10c writes data into memory cells of FIG. 22 associated with the data YA2 representing "0" which is the most significant digit of the binary number for selecting the bit lines bita0-bita7, and the data generating portion 11c writes data into memory cells of FIG. 22 associated with the data YA2 representing "1". The memory cells are then classified into two groups depending on the "0" and "1" states of the most significant digit of the binary number.

In the above described arrangement, the same data are written into the memory cells having the same X address and included in the same group defined depending upon the "0" and "1" states of the most significant digit. The test pattern generating circuit TPGC5 writes the input data DI into the memory cells as illustrated in FIG. 22.

A problem created by writing data into the RAM on the basis of the regularity of the first to fifth preferred embodiments is described below with reference to FIG. 22. It is assumed that a memory cell specified by address data is fault), due to floating and a short circuit occurs between bit lines.

A memory cell connected to the bit line bita0 is supposed to be floating. As described in the first to fifth preferred embodiments, the "0" and "1" states are alternately repeated on the bit line bita0 when data are read. Then, the fault in the RAM 3 due to floating should be detected. However, if the adjacent bit lines bita0 and bita1 are short-circuited, the memory cell specified by the same X address as the memory cell specified by the address data causes the bit line bita0 to be at the same potential as the bit line bita1. Then, the fault in the RAM 3 is not detected.

Such a problem may be solved by writing different data into the memory cells included in the same group, having the same X address, and connected to adjacent bit lines. That is, exclusive data should be written into memory cells having the same logic of the data YA2 and the same X address but having adjacent Y addresses. A test circuit arrangement for implementing the above described solution is discussed below.

Figure 24:
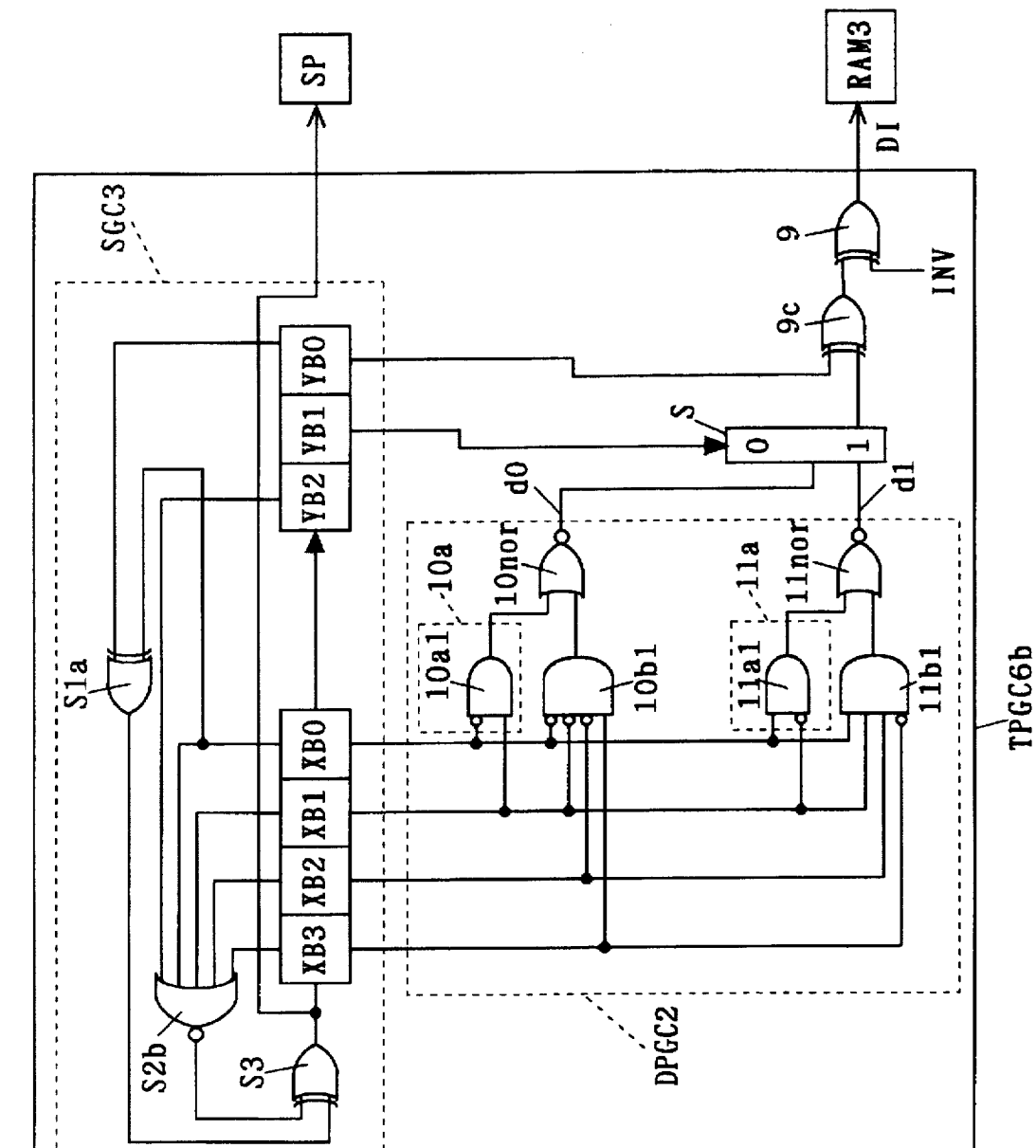
FIG. 24 is a circuit diagram illustrating a structure of a test circuit according to a sixth preferred embodiment.

FIG. 24 is a circuit diagram of a test pattern generating circuit TPGC6 according to the sixth preferred embodiment of the present invention. The test pattern generating circuit TPGC6 is similar in construction to the test patten generating circuit TPGC5 of FIG. 23 except that the test patten generating circuit TPGC6 further comprises an EX-OR gate 9c. Only the difference will be discussed below.

The EX-OR gate 9c receives the data YB0 and the output from the selector S to provide an output to the EX-OR gate 9 which also receives the data inversion signal INV. The EX-OR gate 9c provides the inverted logic of the output from the selector S to the EX-OR gate 9 when the data YB0 is "1", and provides the non-inverted logic thereof to the EX-OR gate 9 when the data YB0 is "0".

Figure 25:
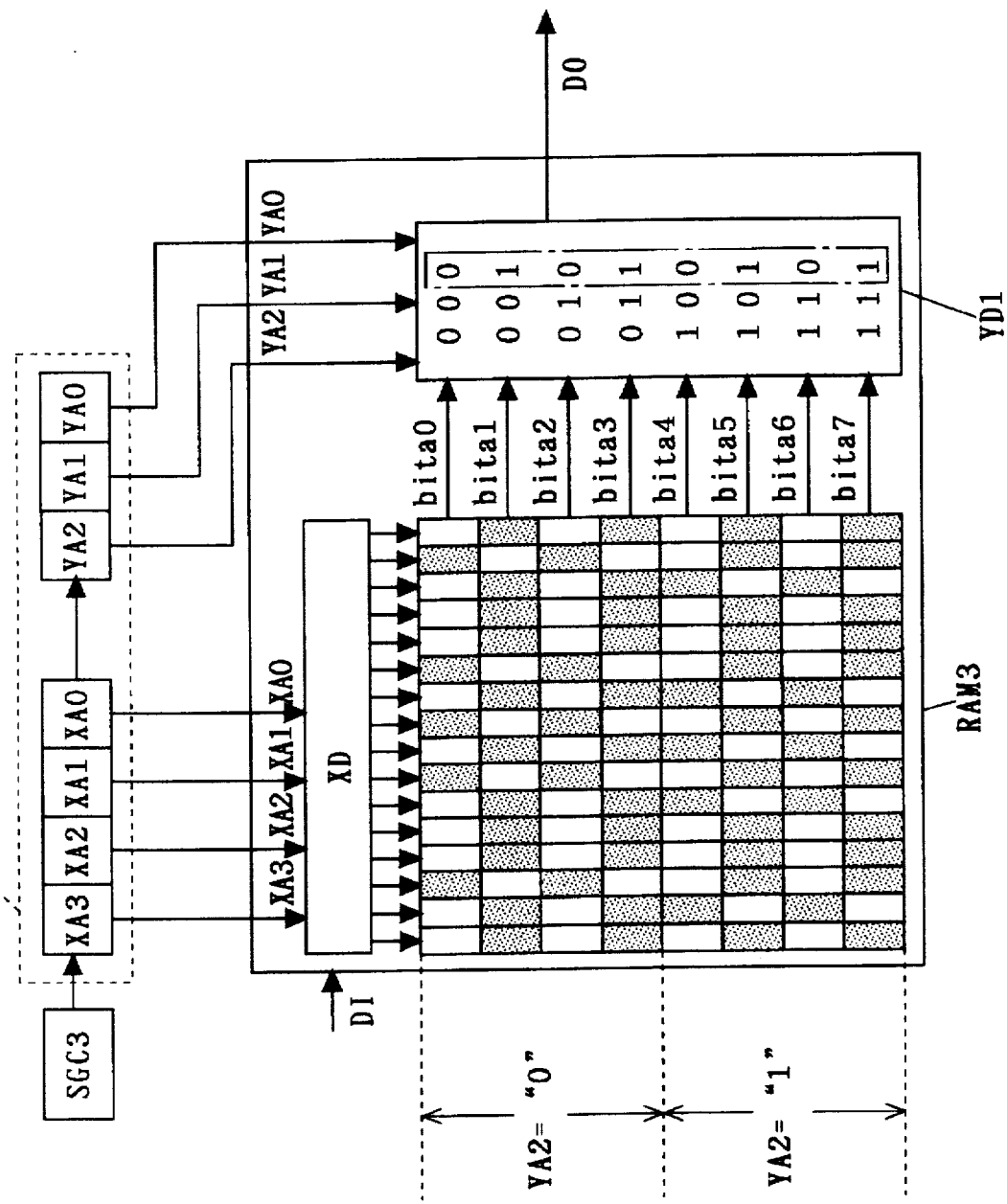
FIG. 25 is a circuit diagram illustrating a structure of a RAM written with data by the test circuit of FIG. 24.

FIG. 25 is a circuit diagram of the RAM 3 having memory cells written with data by the test pattern generating circuit TPGC6 shown in FIG. 24. As illustrated in FIG. 25, memory cells having the same X address and adjacent Y addresses in each group having the same logic of the data YA2 are written with exclusive logics. The principle of such logic writing will be described below.

The bit lines bita0–bita7 for the RAM 3 correspond to the values "000" to "111" of the binary number which are arranged in ascending numeric order as above described, the binary number being provided by the Y decoder YD1 decoding the data YA2–YA0. Such corresponding relation causes adjacent binary number values for specifying adjacent bit lines to inevitably contain different logics of the data YA0 which is the least significant digit as shown surrounded by the dashed-and-dotted lines of FIG. 25.

The data YA0 and the data YB0 of FIG. 24 are provided in a pair and have the same logic. The output from the selector S which is determined to be inverted or non-inverted by the EX-OR gate 9c receiving the logic of the data YB0 causes different logics to be stored in the memory cells having the same X address and the Y addresses adjacent to each other in the direction of the selection thereof.

More specifically, the data stored in the memory cells as illustrated in FIG. 22 are inverted in only the memory cells connected to the bit lines associated with the data YA0 representing "1" and are then stored in the memory cells as illustrated in FIG. 25. As may be apparent from FIG. 25, the value opposite to an expected value is read if the adjacent bit lines are short-circuited in each of the groups defined depending on the most significant digit of the binary number. In this manner, the detection of the fault in the RAM 3 is ensured. This increases the reliability of the test pattern generating circuit TPGC6 over that of the test pattern generating circuit TPGC5 shown in FIG. 23.

The inputting of the data YB0 to the EX-OR gate 9c is associated with the corresponding relation between the bit lines and the binary number such that the logics of the data YA0 which is the least significant digit of the binary number for selection of the bit lines bita0–bita7 of FIG. 25 are different from each other for adjacent bit lines. In other words, the data YB0 paired with the data YA0 is applied to the EX-OR gate 9c in accordance with the fact that the data YA0 serves as a reference for bit line arrangement.

Figure 27:
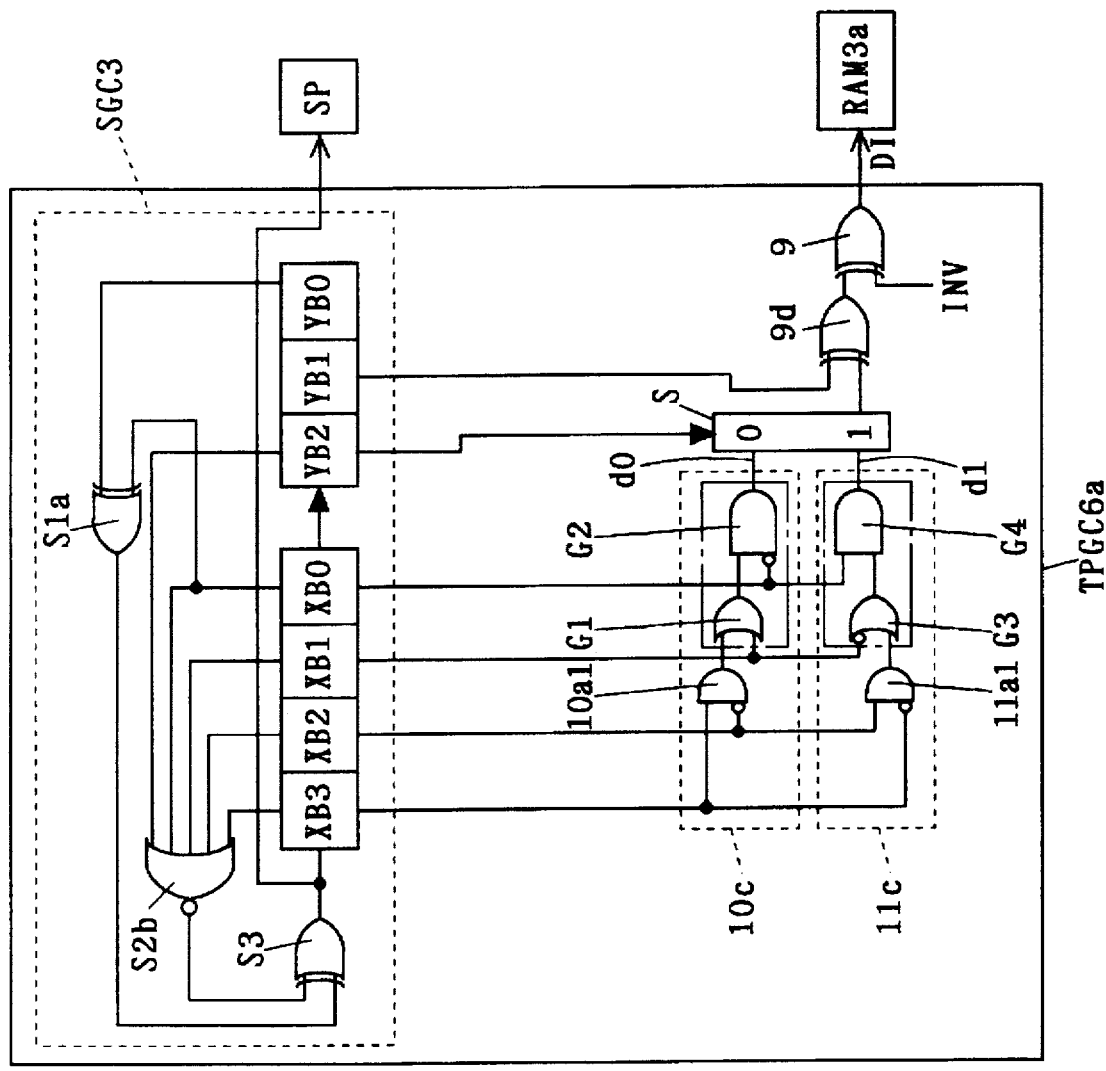
FIG. 27 is a circuit diagram illustrating a structure of a test circuit used for the RAM of FIG. 26.

However, the EX-OR gate 9c shown in FIG. 24 must be replaced with an EX-OR gate 9d shown in FIG. 27 having a first input for receiving the data YB1 when the bit lines bita0–bita7 correspond to the binary number so that the logics of the data YA1 for adjacent bit lines are different from each other, or when the data YA1 serves as a reference for the bit line arrangement, as illustrated in FIG. 26. FIG. 26 is a circuit diagram of a RAM 3a with the bit lines bita0–bita7 arranged using the data YA1 as a reference, and FIG. 27 is a circuit diagram of a test pattern generating circuit TPGC6a for outputting a test pattern to the RAM 3a.

The use of the test patten generating circuit TPGC6a which determines whether to invert the output from the selector S or not in accordance with the data YB1 as illustrated in FIG. 27 allows the different logics of the adjacent bit lines in the same group in the arrangement of FIG. 26.

Figure 28:
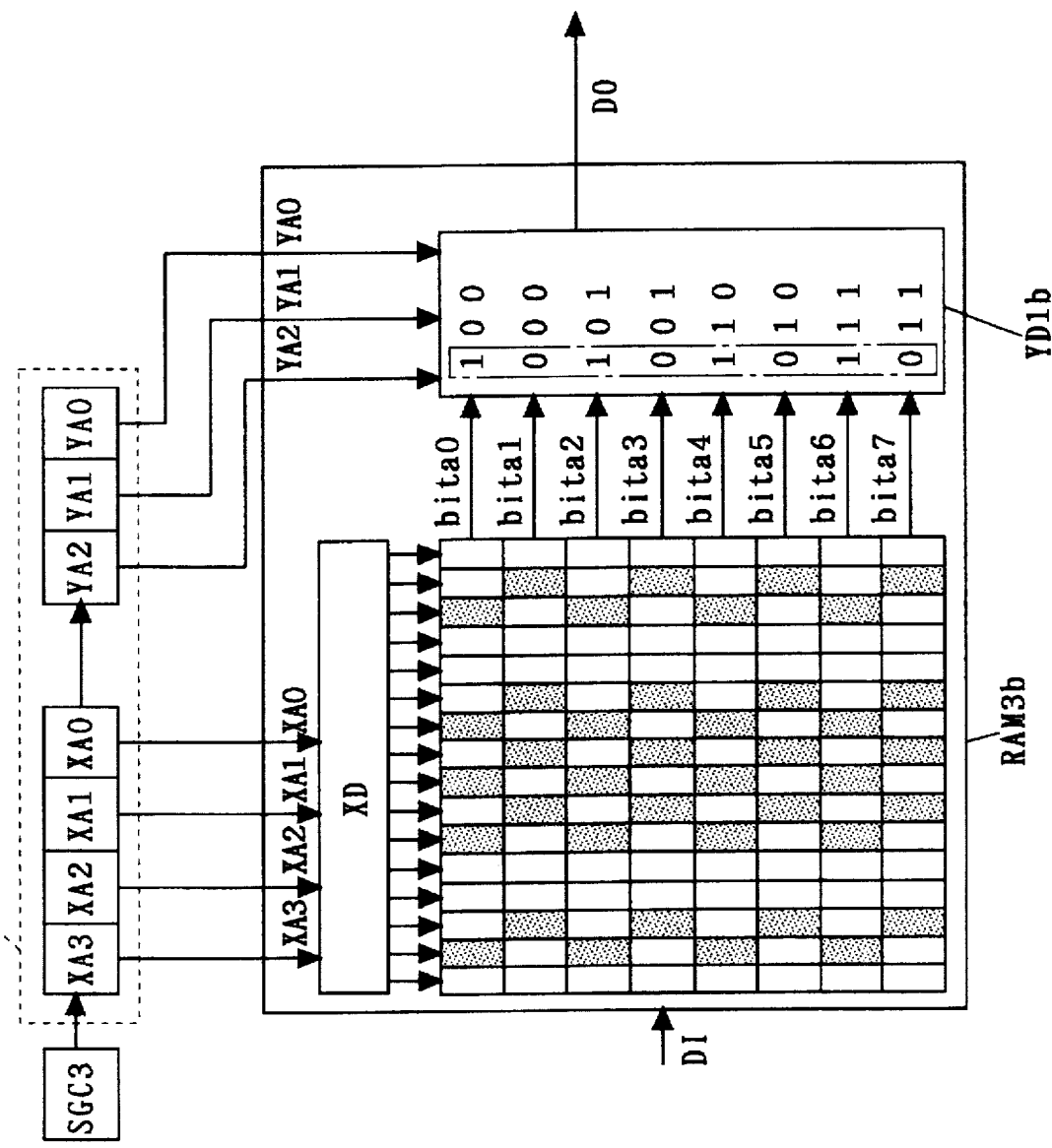
FIG. 28 is a circuit diagram illustrating a structure of a RAM using the most significant digit of a binary number as a reference.

It should be noted that the data stored in the memory cells having the same X address and the Y addresses adjacent to each other in the direction of the selection thereof are not necessarily the same when data are written into the RAM on the basis of the regularity of the first to fifth preferred embodiments using as a bit line arrangement reference the data YA2 which is the most significant digit of the Y address and which is used for grouping the bit lines bita0–bita7. This is because the selector S shown in FIG. 27 does the switching between the outputs from the data generating portions 10c and 11c on the basis of the data YB2 paired with the data YA2 of FIG. 26. FIG. 28 is a circuit diagram of a RAM 3b wherein data are written on the basis of the regularity of the first to fifth preferred embodiments and the bit lines bita0–bita7 are arranged using the data YA2 as a reference, for example.

In this case, the logics stored in the memory cells having the same X address and the Y addresses adjacent to each other in the direction of the selection thereof are not necessarily different from each other even if whether to invert the input data DI applied to the RAM 3b or not is determined depending upon the "0" and "1" states of the data YA2. Thus, satisfactory effects are not achieved when the bit lines are arranged alternately using the data for grouping as a reference.

The RAMs 3, 3a and 3b having the 3-bit Y address are used as an example in the above description. The test pattern generating circuit of the sixth preferred embodiment is also effective for the RAM including a Y address containing two bits or not less than four bits. The bit lines should be arranged using as a reference the data indicative of the Y address except the most significant one used for bit line grouping, and the test pattern generating circuit should inverts or non-inverts data depending upon the logic of the reference data.

All of the data applied to any bit line are inverted or non-inverted. Thus, the use of the construction for determining the inversion or non-inversion in accordance with the logic of the reference data does not impair such effect that the logics applied from the memory cells to any bit line alternately repeat the "0" and "1" states which has been provided in the first to fifth preferred embodiments.

Figure 29:
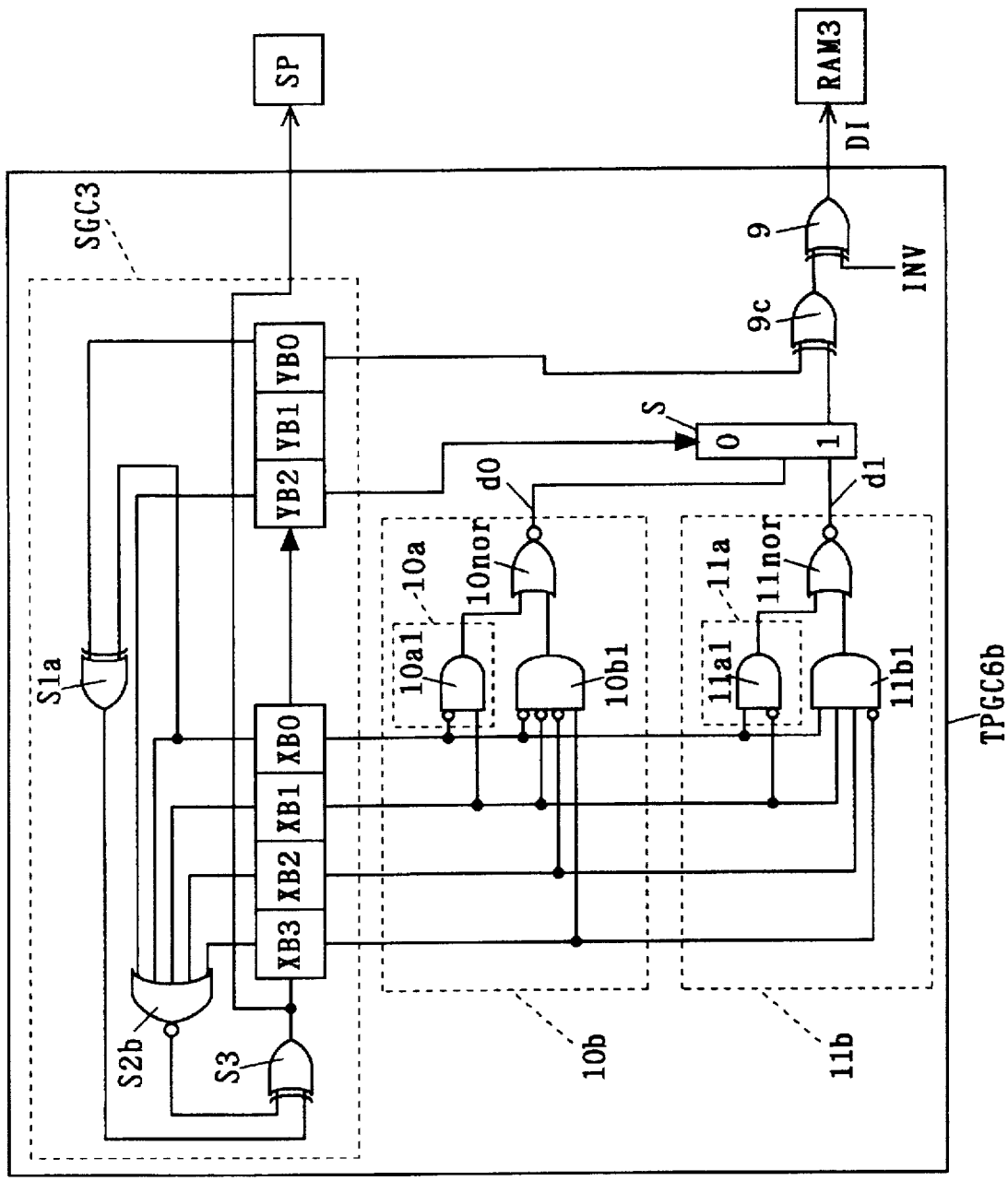
FIG. 29 is a circuit diagram illustrating another structure of the test circuit according to the sixth preferred embodiment.

The data generating portions 10c and 11c are used in the arrangement of FIG. 24, but the principle of the sixth preferred embodiment is applicable when the data generating portions 10b and 11b shown in FIG. 6 are used. FIG. 29 is a circuit diagram of a test pattern generating circuit which comprises the data generating portions 10b and 11b in place of the data generating portions 10c and 11c of FIG. 24.

Furthermore, the address data and test pattern generated by the test pattern generating circuit of the sixth preferred embodiment may be stored in a microprocessor as in the fifth preferred embodiment. In this case, a structure similar to that of FIG. 17 is employed. Additionally, data may be applied from an external tester as in the arrangement of FIG. 21.

While the invention has been described in detail, the foregoing description is in all aspects illustrative and not restrictive. It is understood that numerous other modifications and variations can be devised without departing from the scope of the invention.

I claim:

1. A test circuit comprising a shift register group for row address having first to nth row address registers and a shift register group for column address having first to mth column address registers (n and m are natural numbers of 2 or larger); and said first to nth row address registers and said first to mth column address registers storing different first and second logics constituting a first binary logic, as configuration data configuring address data, said test circuit testing a storage circuit having memory cells that are specified with row address data obtained by decoding said configuration data stored in said first to nth row address registers and column address data obtained by decoding said configuration data stored in said first to mth column address registers:

wherein said nth to first row address registers and said mth to first column address registers are connected in series in this order, said nth row address register being supplied with said configuration data which is shifted in said nth to first row address registers and said mth to first column address registers in this order to provide all cycle sequence data as said address data, and wherein an input terminal of said storage circuit is supplied with test data, said test data selectively taking one of the different first and second logics which constitutes a second binary logic, depending on whether the number s ($n \geq s \geq 0$) of said first logics of said first binary logic continuously stored from said first row address register toward said nth row address register is an even number or an odd number, in a first case where said first logic of said first binary logic is stored in said mth column address register, and said test data selectively taking one of the different first and second logics which constitutes a third binary logic, depending on whether the number t ($n \geq t \geq 0$) of said second logics of said first binary logic continuously stored from said first row address register toward said nth row address register is an even number or an odd number, in a second case where said second logic of said first binary logic is stored in said mth column address register.

2. The test circuit according to claim 1 comprising first and second data supply circuits: and said first and second data supply circuits respectively supplying total logic operation results in said first and second data supply circuits, said first to nth row address registers respectively storing first to nth data provided by said configuration data, wherein when n is an odd number, said first data supply circuit obtains $\{(n-1)/2\}$ first logic operation results which are ANDs of a logic of said (2a-1)th (a is a natural number and satisfies $2 \leq a \geq (n+1)/2$) data and inverse logics of said first to (2a-2)th data, said total logic operation result in said first data supply circuit being OR or NOR of logics of said first logic operation results and a logic of said first data, said second data supply circuit obtains $\{(n-1)/2\}$ second logic operation results which are ANDs of an inverse logic of said (2a-1)th data and logics of said first to (2a-2)th data, and said total logic operation result in said second data supply circuit being OR or NOR of logics of said second logic operation results and an inverse logic of said first data, and wherein when n is an even number, said first data supply circuit obtains n/2 third logic operation results which are ANDs of a logic of said 2bth (b is a natural number and satisfies $1 \leq b \leq n/2$) data and inverse logics of said first to (2b-1)th data, said total logic operation result in said first data supply circuit being OR or NOR of said third logic operation results, said second data supply circuit obtains n/2 fourth logic operation results which are ANDs of an inverse logic of said 2bth data and logics of said first to (2b-1)th data, and said total logic operation result in said second data supply circuit being OR or NOR of said fourth logic operation results; and wherein said total logic operation results in said first and second data supply circuits are supplied as said test data in said first and second cases, respectively.

3. The test circuit according to claim 1 comprising first and second data supply circuits: and said first and second data supply circuits supplying total logic operation results in said first and second data supply circuits, respectively, said first to nth row address registers respectively storing first to nth data provided by said configuration data, said first and second data supply circuits each including first to (n-1)th logic operation elements provided in correspondence with said first to (n-1)th row address registers, said first to (n-1)th logic operation elements providing first to (n-1)th results, respectively, wherein said (n-1)th logic operation element of said first data supply circuit provides said (n-1)th result in said first data supply circuit which is AND of a logic of said nth data and an inverse logic of said (n-1)th data, said (n-1)th logic operation element of said second data supply circuit provides said (n-1)th result in said second data supply circuit which is AND of an inverse logic of said nth data and a logic of said (n-1)th data, said (n-a)th (a is an odd number and satisfies $1 < a < n$) logic operation element of said first data supply circuit provides said (n-a)th result in said first data supply circuit which is AND of a logic of said (n-a+1)th result in said first data supply circuit and an inverse logic of said (n-a)th data, said (n-a)th logic operation element of said second data supply circuit provides said (n-a)th result in said second data supply circuit which is AND of a logic of said (n-a+1)th result in said second data supply circuit and a logic of said (n-a)th data, said (n-b)th (b is an even number and satisfies $2 \leq b \leq n$) logic operation element of said first data supply circuit provides said (n-b)th result in said first data supply circuit which is OR of a logic of said (n-b+1)th result in said first data supply circuit and a logic of said (n-b)th data, and said (n-b)th logic operation element of said second data supply circuit provides said (n-b)th result in said second data supply circuit which is OR of a logic of said (n-b+1)th result in said second data supply circuit and an inverse logic of said (n-b)th data; and said total logic operation result in said first data supply circuit being a logic of said first result in said first data supply circuit or its inversion logic, said total logic operation result in said second data supply circuit being a logic of said first result in said second data supply circuit or its inversion logic, and wherein said total logic operation results in said first and second data supply circuits are provided as said test data in said first and second cases, respectively.

4. The test circuit according to claim 1, wherein said input terminal of said storage circuit is a data input terminal to which write data to be written into said memory cells is inputted.

5. The test circuit according to claim 2, wherein said input terminal of said storage circuit is a data input terminal to which write data to be written into said memory cells is inputted.

6. The test circuit according to claim 3, wherein said input terminal of said storage circuit is a data input terminal to which write data to be written into said memory cells is inputted.

7. The test circuit according to claim 4, wherein an output terminal of said storage circuit is connected to a first input terminal of a comparison circuit, a second input terminal of said comparison circuit is supplied with said test data, said storage circuit is supplied with an enable signal for controlling writing of said write data into said memory cells, and said enable signal indicates "enable" when writing into said memory cells and indicates "disable" when reading from said memory cells.

8. The test circuit according to claim 5, wherein an output terminal of said storage circuit is connected to a first input terminal of a comparison circuit, a second input terminal of said comparison circuit is supplied with said test data, said storage circuit is supplied with an enable signal for controlling writing of said write data into said memory cells, and said enable signal indicates "enable" when writing into said memory cells and indicates "disable" when reading from said memory cells.

9. The test circuit according to claim 6, wherein an output terminal of said storage circuit is connected to a first input terminal of a comparison circuit, a second input terminal of said comparison circuit is supplied with said test data, said storage circuit is supplied with an enable signal for controlling writing of said write data into said memory cells, and said enable signal indicates "enable" when writing into said memory cells and indicates "disable" when reading from said memory cells.

10. The test circuit according to claim 1, wherein said input terminal of said storage circuit is an enable terminal relating to writing of data into said memory cells, said storage circuit has a data input terminal to which write data to be written into said memory cells is inputted, a logic of said write data takes first and second logics constituting a fourth binary logic, and a logic of said test data inputted to said enable terminal takes an inverted state or a non-inverted state depending on whether said logic of said write data takes said first logic or said second logic of said fourth binary logic.

11. The test circuit according to claim 2, wherein said input terminal of said storage circuit is an enable terminal relating to writing of data into said memory cells, said storage circuit has a data input terminal to which write data to be written into said memory cells is inputted, a logic of said write data takes first and second logics constituting a fourth binary logic, and a logic of said test data inputted to said enable terminal takes an inverted state or a non-inverted state depending on whether said logic of said write data takes said first logic or said second logic of said fourth binary logic.

12. The test circuit according to claim 3, wherein said input terminal of said storage circuit is an enable terminal relating to writing of data into said memory cells, said storage circuit has a data input terminal to which write data to be written into said memory cells is inputted, a logic of said write data takes first and second logics constituting a fourth binary logic, and a logic of said test data inputted to said enable terminal takes an inverted state or a non-inverted state depending on whether said logic of said write data takes said first logic or said second logic of said fourth binary logic.

13. The test circuit according to claim 1 which is a storage means storing said configuration data and said test data in itself.

14. The test circuit according to claim 1, wherein a first signal, stored in one of said first to (m−1)th column address registers, takes differenct logics for two of said memory cells which are adjacent to each other in a direction in which said column address data selects said memory cells, and whether to invert said test data or not is determined depending upon said first signal.

15. The test circuit according to claim 2, wherein a first signal, stored in one of said first to (m−1)th column address registers, takes differenct logics for two of said memory cells which are adjacent to each other in a direction in which said column address data selects said memory cells, and whether to invert said test data or not is determined depending upon said first signal.

16. The test circuit according to claim 3, wherein a first signal, stored in one of said first to (m−1)th column address registers, takes differenct logics for two of said memory cells which are adjacent to each other in a direction in which said column address data selects said memory cells, and whether to invert said test data or not is determined depending upon said first signal.

17. The test circuit according to claim 14 which is a storage means storing said configuration data and said test data in itself.

* * * * *